United States Patent
Kuan et al.

(10) Patent No.: US 12,148,794 B2
(45) Date of Patent: *Nov. 19, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shu Kuan, Keelung (TW); Shahaji B. More, Hsinchu (TW); Chien Lin, Hsinchu (TW); Cheng-Han Lee, New Taipei (TW); Shih-Chieh Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 71 days.

This patent is subject to a terminal disclaimer.

(21) Appl. No.: 17/853,687

(22) Filed: Jun. 29, 2022

(65) Prior Publication Data
US 2022/0328621 A1     Oct. 13, 2022

Related U.S. Application Data

(63) Continuation of application No. 16/934,887, filed on Jul. 21, 2020, now Pat. No. 11,393,898.

(Continued)

(51) Int. Cl.
*H01L 29/06* (2006.01)
*H01L 29/161* (2006.01)
*H01L 29/423* (2006.01)

(52) U.S. Cl.
CPC .... *H01L 29/0649* (2013.01); *H01L 29/42392* (2013.01); *H01L 29/0669* (2013.01); *H01L 29/161* (2013.01)

(58) Field of Classification Search
CPC ........... H01L 29/0649; H01L 29/42392; H01L 29/0669; H01L 29/161; H01L 29/0673;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

CN   106128958 A   11/2016
CN   109427672 A   3/2019

OTHER PUBLICATIONS

Non-Final Office Action issued in U.S. Appl. No. 16/934,887, dated Sep. 15, 2021.
(Continued)

*Primary Examiner* — Dao H Nguyen
(74) *Attorney, Agent, or Firm* — STUDEBAKER & BRACKETT PC

(57) ABSTRACT

In a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched, thereby forming a source/drain space, the first semiconductor layers are laterally etched through the source/drain space, and a source/drain epitaxial layer is formed in the source/drain space. An inner spacer made of a dielectric material is formed on an end of each of the etched first semiconductor layers and at least one of the spacer has width changes along vertical direction of device. At least one of the first semiconductor layers has a composition different from another of the first semiconductor layers.

20 Claims, 21 Drawing Sheets

Related U.S. Application Data

(60) Provisional application No. 62/982,715, filed on Feb. 27, 2020.

(58) Field of Classification Search
CPC .......... H01L 29/66439; H01L 29/0847; H01L 29/165; H01L 29/78696; H01L 29/775; H01L 21/823412; H01L 21/823431; H01L 21/823481; B82Y 10/00
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,411,119 B2 | 9/2019 | Lee et al. |
| 11,205,706 B2 | 12/2021 | Yang et al. |
| 11,393,898 B2* | 7/2022 | Kuan ................ H01L 29/66553 |
| 2011/0003451 A1* | 1/2011 | Orlowski .......... H01L 29/78696 257/E21.409 |
| 2017/0236900 A1 | 8/2017 | Chang et al. |
| 2018/0301531 A1* | 10/2018 | Xie ................... H01L 21/02532 |
| 2018/0358435 A1 | 12/2018 | Mochizuki et al. |
| 2019/0081155 A1* | 3/2019 | Xie ................... H01L 29/66553 |
| 2019/0131431 A1 | 5/2019 | Cheng et al. |
| 2020/0365586 A1 | 11/2020 | Shin et al. |
| 2021/0193829 A1 | 6/2021 | Reznicek et al. |

OTHER PUBLICATIONS

Notice of Allowance issued in U.S. Appl. No. 16/934,887, dated Mar. 3, 2022.

* cited by examiner

METHOD OF MANUFACTURING A SEMICONDUCTOR DEVICE AND A SEMICONDUCTOR DEVICE

RELATED APPLICATION

This application is a continuation of U.S. patent application Ser. No. 16/934,887 filed Jul. 21, 2020, now U.S. Pat. No. 11,393,898, which claims priority to U.S. Provisional Application No. 62/982,715 filed Feb. 27, 2020, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A FIGS. 2A-2D show various views of a semiconductor FET device according to an embodiment of the present disclosure.

DETAILED DESCRIPTION

Figure 1:
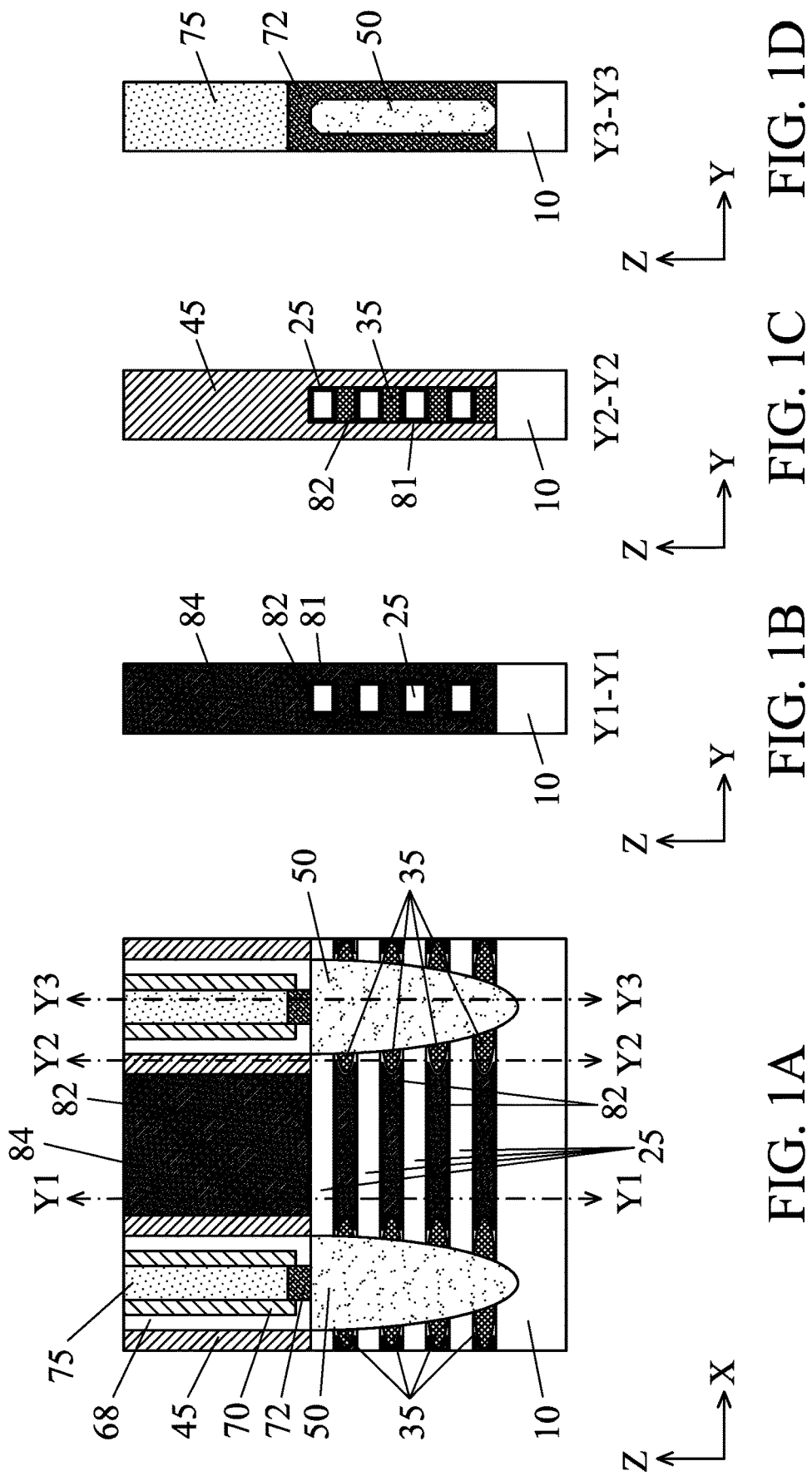
FIGS. 1A-1D show various views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy polysilicon gate is removed, because a lateral etching control or an etching budget for NW release etch is not sufficient. A gate electrode may touch a source/drain (source/drain) epitaxial layer if there is no etch stop layer. Further, there is a larger impact on gate to drain capacitance (Cgd). If no dielectric film existed between the gate and the source/drain region, Cgd becomes larger, which would reduce circuit speed.

Further, in a GAA FET, an inner spacer is provided between a metal gate electrode and a source/drain (source/drain) epitaxial layer. However, it is difficult to control the shape of the inner spacers due to narrow spaces between adjacent semiconductor layers not to be etched. The inner spacers act as an extra source of channel resistance, thereby hindering the gate control capability. A higher channel height in a GAA FET causes more difficulties in controlling a uniformity of the structure from the channel bottom to the channel top in deposition and etching processes. In particular, achieving a higher process uniformity within a 12-inch wafer becomes more difficult in a GAA FET fabrication method.

In the present disclosure, a novel method for fabricating an inner spacer between a metal gate electrode and a source/drain (source and/or drain) epitaxial layer for a GAA FET and a stacked channel FET are provided. In particular, in the present disclosure, the sacrificial semiconductor layers have different composition (e.g., Ge concentration) and the lateral etching of the sacrificial semiconductor layer is controlled by the modulated composition. By employing the different composition, it is possible to control the dimension of the channel regions, thereby improving the gate control capability.

In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A-1D is an n-type FET.

As shown in FIGS. 1A-1C, semiconductor wires or sheets 25 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets 25, which are channel layers, are disposed over the substrate 10. In some embodiments, the semiconductor wires 25 are disposed over a fin structure 29 (see, FIG. 3) protruding from the substrate 10. Each of the channel layers 25 is wrapped around by a gate dielectric layer 82 and a gate electrode layer 84. The thickness of the semiconductor wires 25 is in a range from about 5 nm to about 60 nm and the width of the semiconductor wires 25 is in a range from about 5 nm to about 20 nm in some embodiments. In some embodiments, the width of the semiconductor wires or sheets is greater than the thickness. In certain embodiments, the width is up to twice or five times the thickness of the semiconductor wires or sheets 25.

In some embodiments, an interfacial dielectric layer 81 (omitted in FIG. 1A) is formed between the channel of the semiconductor wire 25 and the gate dielectric layer 82. In some embodiments, the gate dielectric layer 82 includes a high-k dielectric layer. The gate structure includes the gate dielectric layer 82, the gate electrode layer 84 and sidewall spacers 45. Although FIGS. 1A-1C show four semiconductor wires 25, the number of the semiconductor wires 25 is not limited to four, and may be as small as one or more than four, and may be up to ten. By adjusting the number of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, an additional insulating layer (not shown) is conformally formed on the inner surface of the spacer regions.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium. In some embodiments, an etch stop layer 68 is disposed between the sidewall spacers 45 and the ILD layer 70 and on a part of the upper surface of the epitaxial layer 50.

In some embodiments, the FET shown in FIGS. 1A-1D is an n-type FET. The source/drain epitaxial layer 50 includes one or more layer of SiP, SiCP, SiC, SiAs and SiAsP.

As shown FIG. 1A, the cross section along the X direction of the inner spacer 35 has a rounded shape (e.g., semi-circular or U-shape) convex toward the gate electrode.

Figure 2:
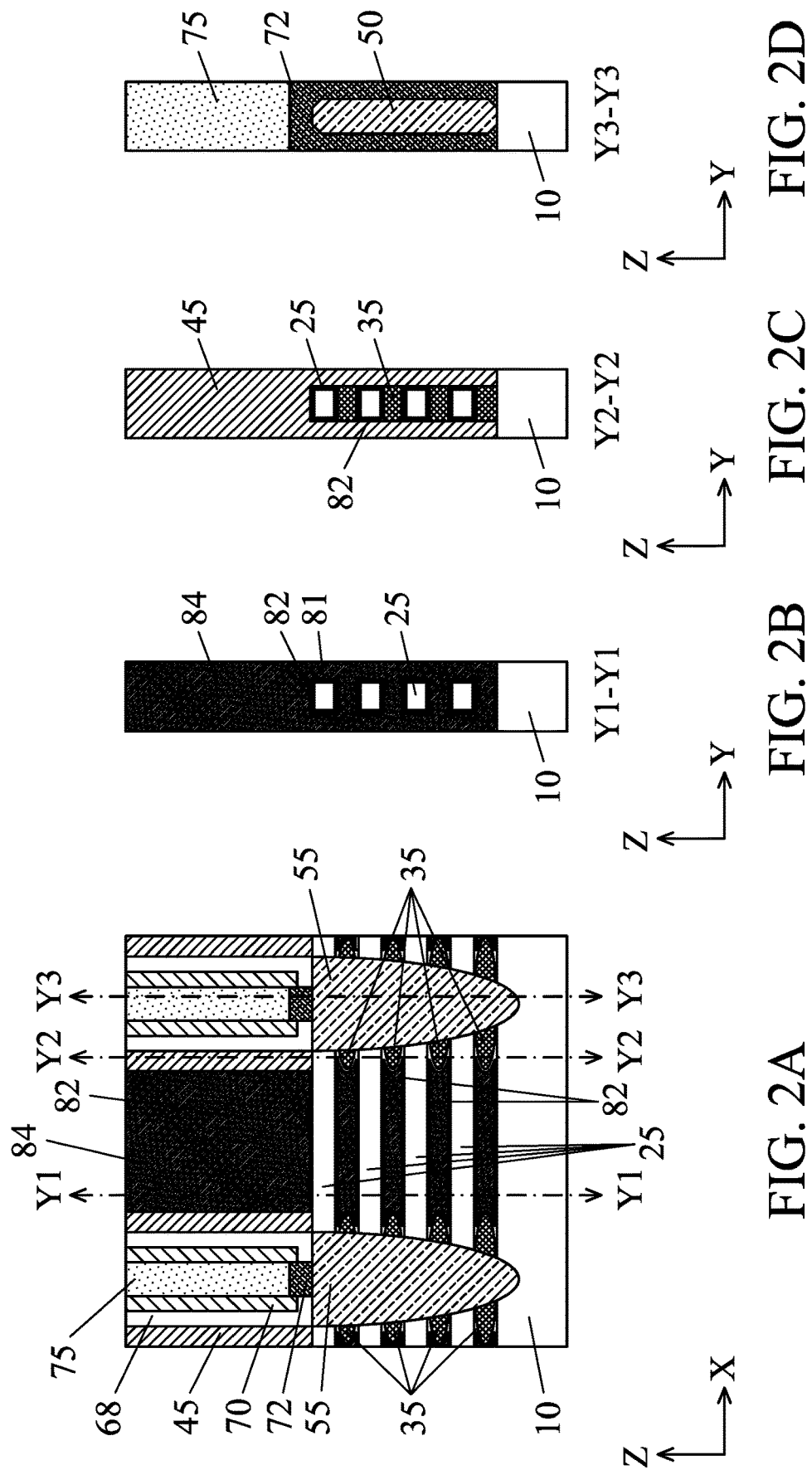
FIG. 2A is a cross sectional view along the X direction (source-drain direction)
FIG. 2B is a cross sectional view corresponding to Y1-Y1 of FIG. 2A.
FIG. 2C is a cross sectional view corresponding to Y2-Y2 of FIG. 2A
FIG. 2D shows a cross sectional view corresponding to Y3-Y3 of FIG. 2A.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted. In some embodiments, the semiconductor GAA FET device of FIGS. 2A-2D is an n-type FET.

In some embodiments, the FET shown in FIGS. 2A-2D is a p-type FET. The source/drain epitaxial layer 55 includes one or more layer of SiGe, SiGeSn, SiSn, Ge, and GeSn.

In some embodiments, two or more of the GAA FETs shown in FIGS. 1A-2D are disposed on one semiconductor substrate (chip) to achieve various circuit functions.

FIGS. 3 to 17 show various stages of manufacturing a semiconductor FET device according to an embodiment of the present disclosure. It is understood that additional operations can be provided before, during, and after processes shown by FIGS. 3-17, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-2D may be employed in the embodiment of FIGS. 3-17, and detailed explanation thereof may be omitted.

Figure 3:
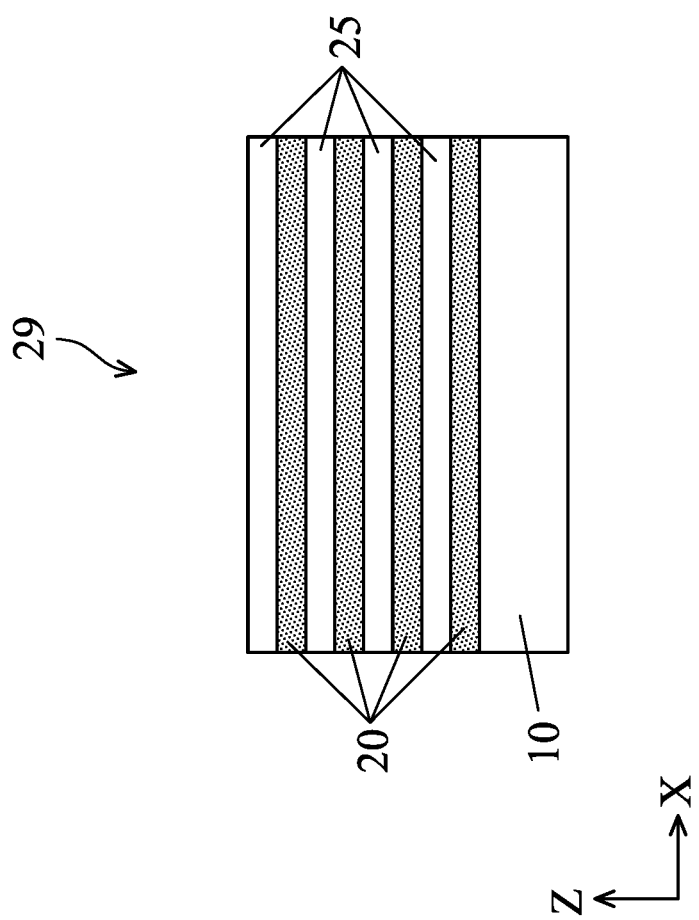
FIG. 3 shows one of the various stages of manufacturing a semiconductor GAA FET device according to an embodiment of the present disclosure.

As shown in FIG. 3, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 3, the numbers are not limited to four, and can be 1, 2, 3 or more than 4, and is less than 20. In some embodiments, the number of the first semiconductor layers 20 is greater by one than the number of the second semiconductor layers 25 (the top layer is the first semiconductor layer).

Figure 4A:
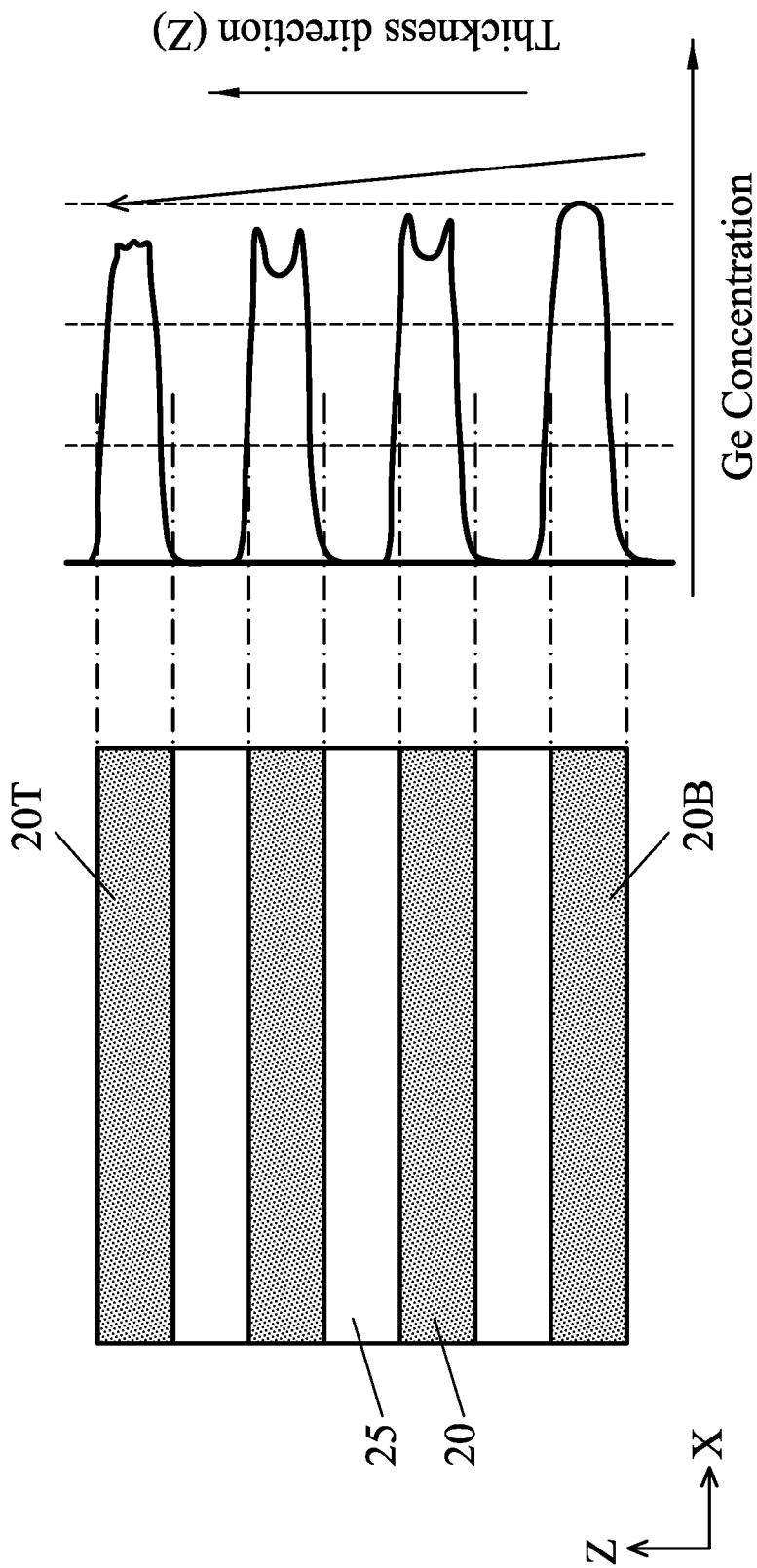
FIGS. 4A, 4B, 4C, 4D and 4E show composition changes (profile) of first semiconductor layers according embodiments of the present disclosure.

In some embodiments of the present disclosure, as shown in FIG. 4A, a Ge concentration in the first semiconductor layers 20 decreases from the bottom to the top. Further, in some embodiments, the composition of Ge (or Si) in one or more of the first semiconductor layers 20 varies. In some embodiments, at least one of the lowermost first semiconductor layer 20B and the uppermost first semiconductor layer 20T has a substantially constant Ge concentration, while one or more middle first semiconductor layers 20 have the variable Ge concentration. When the Ge concentration varies within one first semiconductor layer, the Ge concentration may be defined as the average Ge concentration in the one first semiconductor layer.

In some embodiments, the Ge concentration of the uppermost first semiconductor layer is in a range from about 30% (atomic %) to about 40%. In some embodiments, the remaining first semiconductor layers have the Ge concentration in a range from about 20% to 30%. In some embodiments, the Ge concentration in the first semiconductor layers 20 decreases from the bottom to the top except for the bottommost first semiconductor layer. In such a case, the Ge concentration of the bottommost first semiconductor layer is smaller than that of the uppermost first semiconductor layer and is in a range from about 25% to 35% in some embodiments. The difference of the Ge concentration between adjacent first semiconductor layers (middle portions) is in a range from about 0.5% to 5.0% in some embodiments. For example, one layer has a 25% Ge concentration, and the adjacent layer has 20% or 30%, where the difference is 5%. In other embodiments, the difference is in a range from about 0.6% to 1%.

Figure 4C:
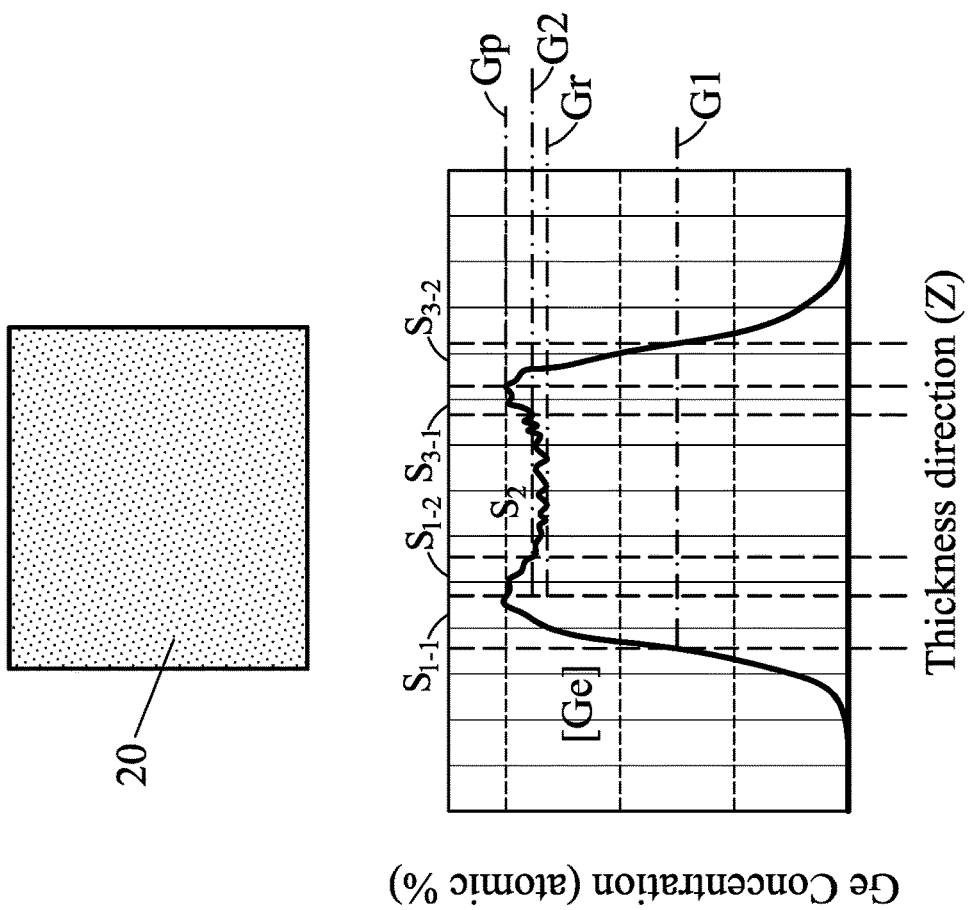
Figure 4B:
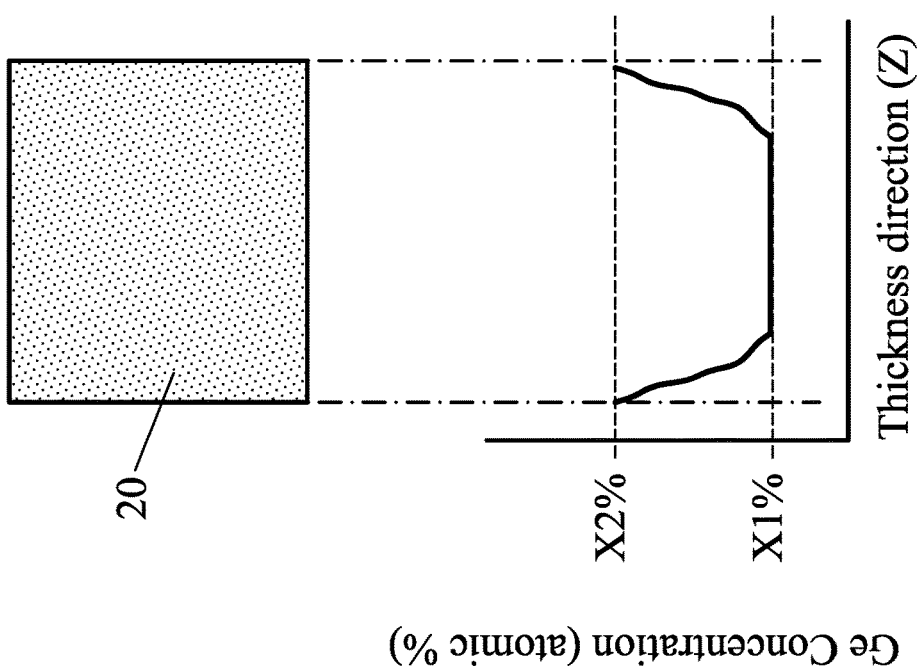

FIG. 4B shows a Ge concentration in one first semiconductor layer 20 having a variable Ge concentration. In some embodiments, as shown in FIG. 4B, the Ge concentration has a substantially constant portion having a concentration X1 and the Ge concentration increases to X2 at the edges (interface to the second semiconductor layer 25). In some embodiments, the Ge concentration linearly increases, and in other embodiments, the Ge concentration increases gradually (not linear). In some embodiments, X1 is in a range from about 15% to about 35% and is in a range from about 20% to about 30% in other embodiments. In some embodiments, X2 is in a range from about 25% to about 50% and is in a range from about 30% to about 40% in other embodiments. In some embodiments, X2-X1 is about 2 (%) to about 20(%). In some embodiments, the thickness of the constant portion is about 20% to about 60% of the total thickness of one first semiconductor layer. In some embodiments, there is no constant portion and the Ge concentration has a U-shape or a V-shape profile along the thickness direction. In some embodiments, the Ge concentration is symmetric and in other embodiments, the Ge concentration is asymmetric, along the thickness direction with respect to the center of the first semiconductor layer.

FIG. 4C shows a Ge concentration in one first semiconductor layer 20 in other embodiments. As shown in FIG. 4C, the Ge concentration has two peaks. In some embodiments, the Ge concentration at the one peak is equal to or different from the Ge concentration of the other peak. The region S1-1 and S3-2 are regions from an edge (interface to the second semiconductor layer 25) to the peak portion, the regions S1-2 and S3-1 are regions from the peak portion to the substantially constant region S2. In some embodiments, the substantially constant portion S2 is a region having a Ge concentration variation of less than 2% (G2–Gr<2%). The constant or the minimum Ge concentration Gr in the constant region S2 is in a range from about 20% to about 30% in some embodiments. The peak concentration Gp is in a range from about $1.3 \times Gr$ to about $1.7 \times Gr$. The Ge concentration G1 at the interface between the first semiconductor layer 20 and the second semiconductor layer 25 is in a range from about $0.1 \times Gr$ to about $0.5 \times Gr$.

The thickness of the regions S1-1 and S3-2 is in a range from about 3 nm to about 10 nm and is in a range from about 4 nm to about 8 nm in other embodiments. The thickness of the regions S1-2 and S3-1 is in a range from about 3 nm to about 10 nm and is in a range from about 4 nm to about 8 nm in other embodiments. The thickness of the region S2 is in a range from about 5 nm to about 20 nm and is in a range from about 8 nm to about 15 nm in other embodiments. In some embodiments, the Ge concentration changes in a step-wise manner having, for example, two high Ge regions and one low Ge region, or two high Ge regions, two middle Ge regions and one low Ge region.

In some embodiments, the uppermost first semiconductor layer has a smaller thickness than the remaining first semiconductor layers. In some embodiments, the uppermost second semiconductor layer has a smaller thickness than the remaining second semiconductor layers. In some embodiments, after a fin structure is formed as explained below, the uppermost first (and second) semiconductor layer is removed by a polishing operation.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the Ge concentration is changed by changing the source gas flow rates, deposition pressure and/or deposition temperature.

Figure 4D:
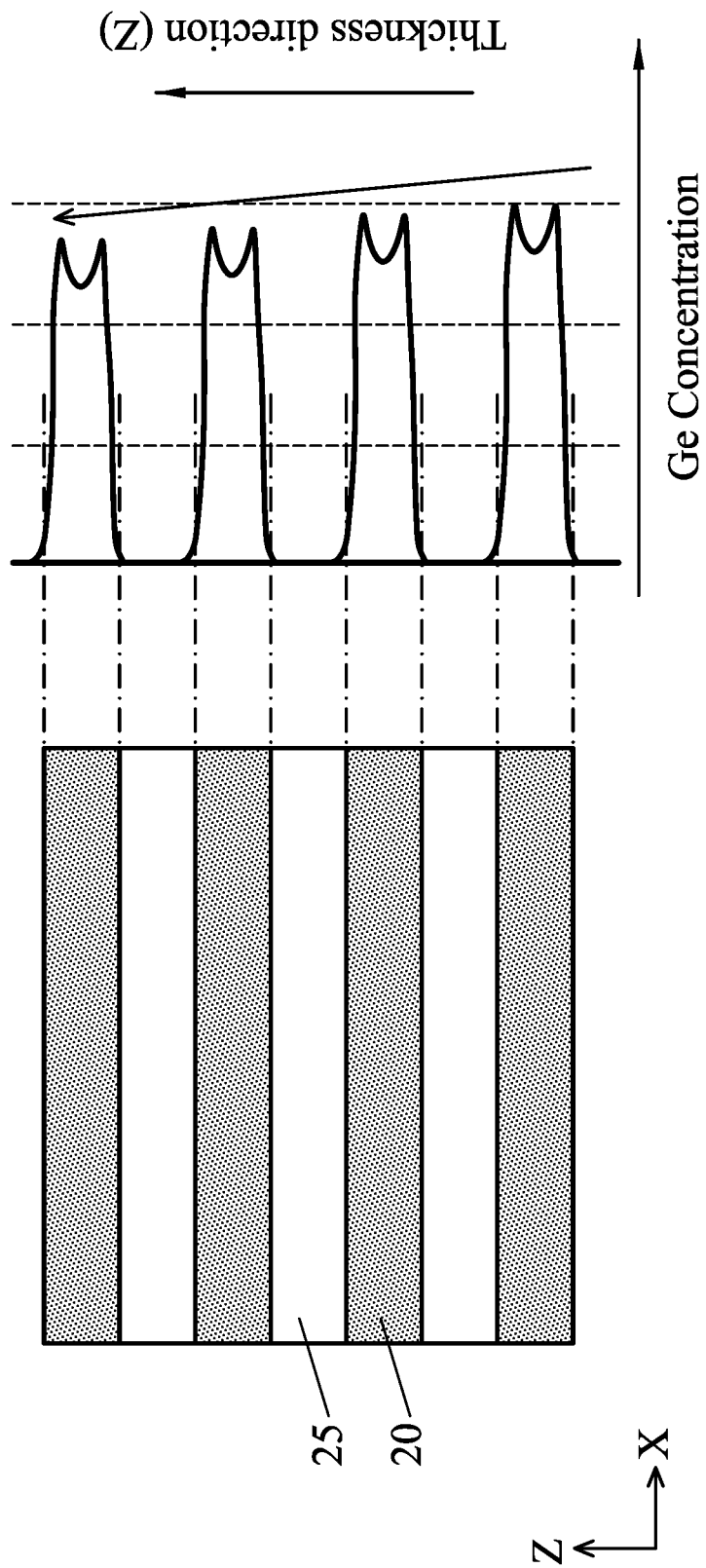

FIG. 4D shows a Ge concentration in the first semiconductor layers 20 in other embodiments. In this embodiment, all of the first semiconductor layers 20 have the variable Ge concentration as set forth above, and the Ge concentration of the first semiconductor layers 20 decreases from the bottom to the top.

Figure 4E:
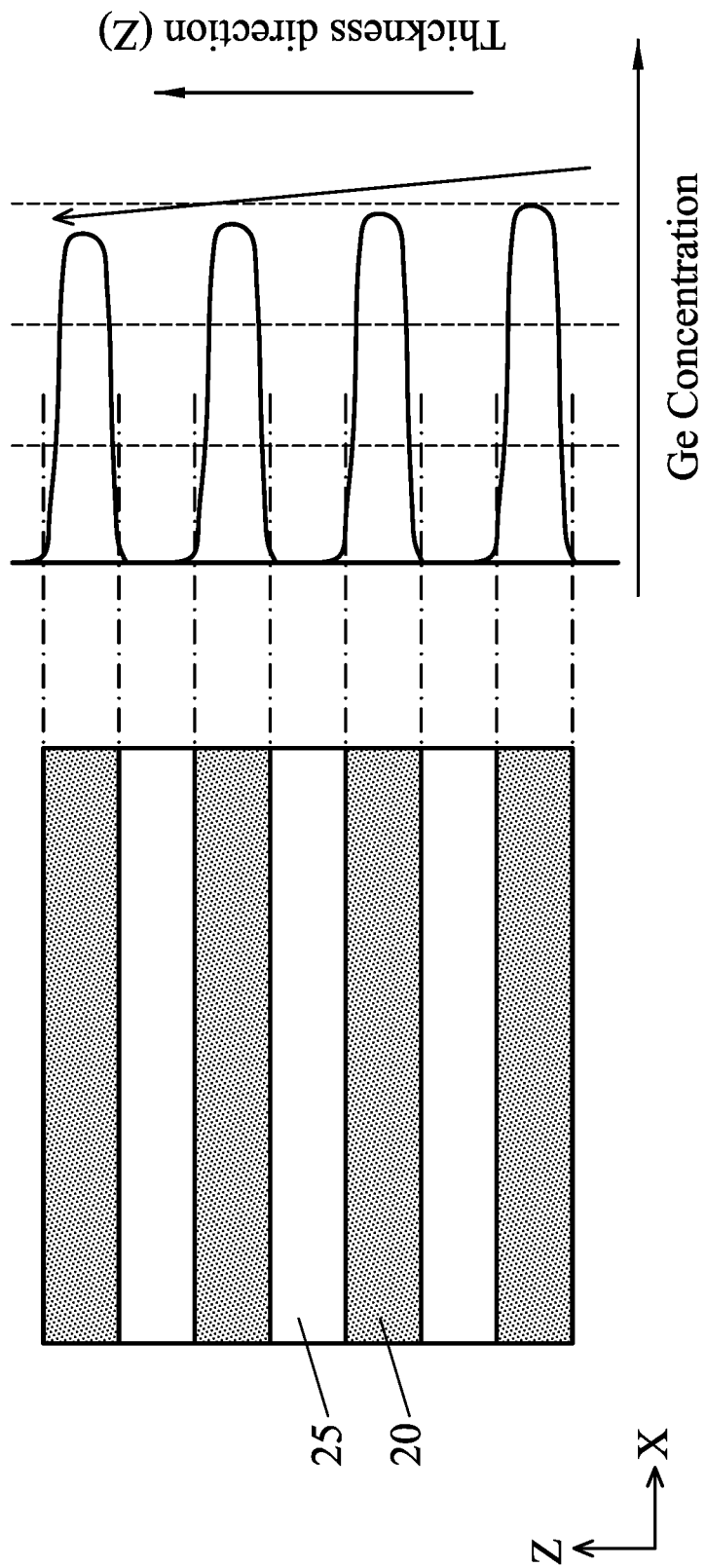

FIG. 4E shows a Ge concentration in the first semiconductor layers 20 in other embodiments. In this embodiment, all of the first semiconductor layers 20 have a constant Ge concentration, and the Ge concentration of the first semiconductor layers 20 decreases from the bottom to the top.

Figure 5:
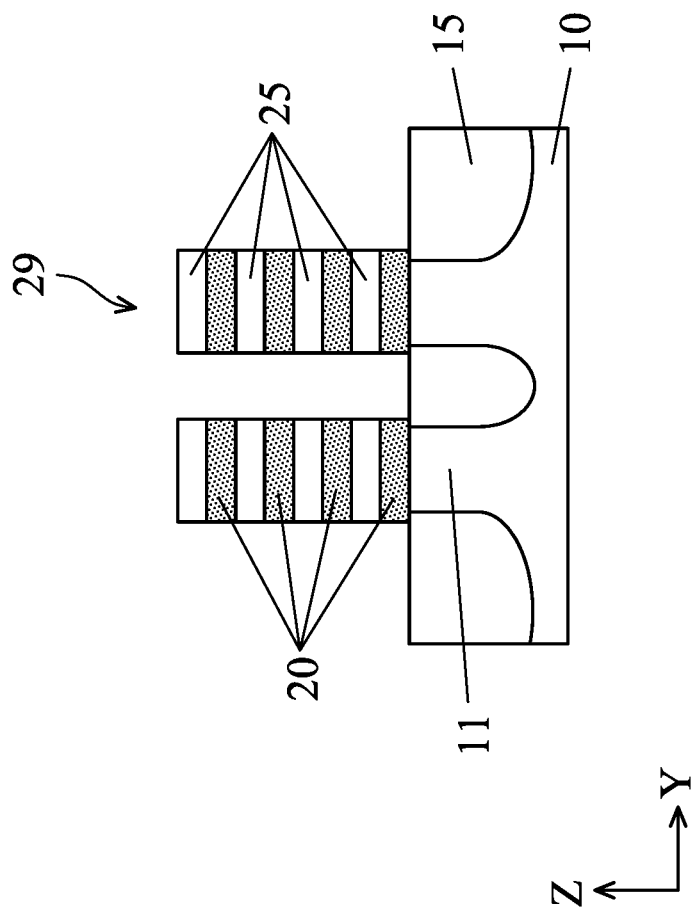
FIG. 5 shows one of the various stages of manufacturing a semiconductor GAA FET device according to an embodiment of the present disclosure.

After the stacked semiconductor layers are formed, fin structures are formed by using one or more lithography and etching operations, as shown in FIG. 5. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 5, the fin structures 29 extend in the X direction and are arranged in the Y direction. The number of the fin structures is not limited to two as shown in FIG. 5, and may be as small as one and three or more. In some embodiments, one or more dummy fin structures are formed on both sides of the fin structures 29 to improve pattern fidelity in the patterning operations. As shown in FIG. 5, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part 11 of the fin structures 29, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 5, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 29 is not exposed. The first semiconductor layers 20 are sacrificial layers which are subsequently removed, and the second semiconductor layers 25 are subsequently formed into semiconductor wires as channel layers of an n-type GAA FET. For a p-type GAA FET, the second semiconductor layers 25 are sacrificial layers which are subsequently partially removed, and the first semiconductor layers 20 are subsequently formed into semiconductor wires as channel layers.

Figure 6A:
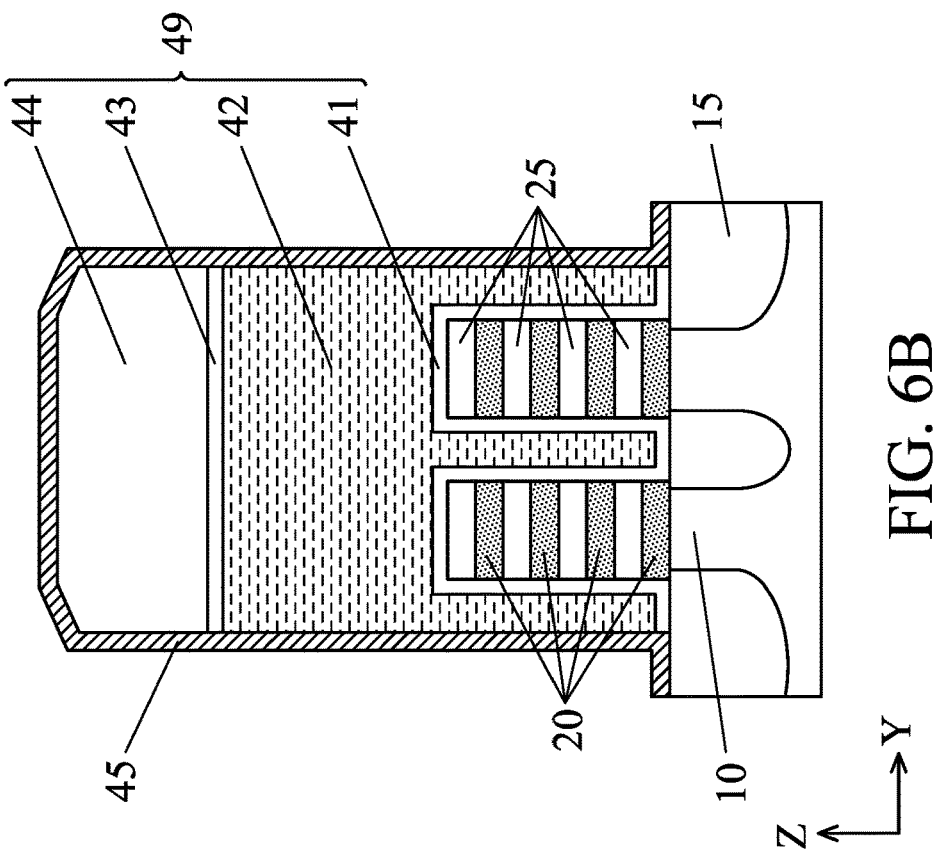
FIGS. 6A and 6B show one of the various stages of manufacturing a semiconductor GAA FET device according to an embodiment of the present disclosure.
Figure 6B:
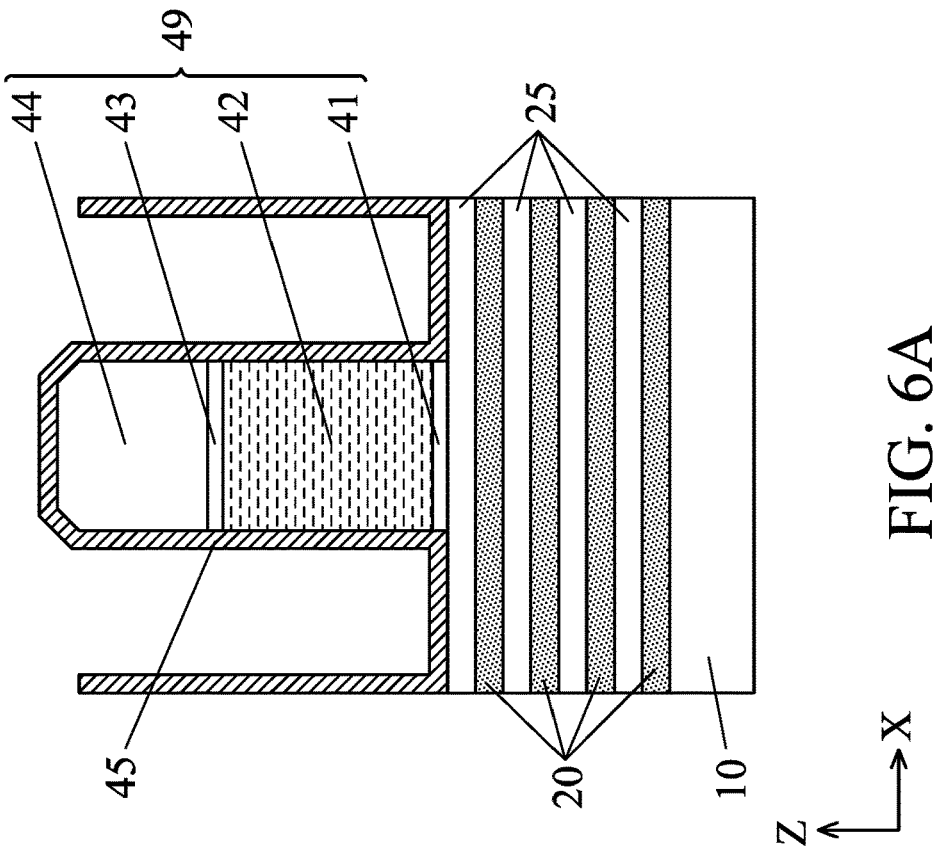

After the isolation insulating layer 15 is formed, a sacrificial (dummy) gate structure 49 is formed, as shown in FIGS. 6A and 6B. FIGS. 6A and 6B illustrate a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 49, as shown in FIGS. 6A and 6B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 6A and 6B. In this disclosure, a source and a drain are interchangeably used and the structures thereof are substantially the same. In FIGS. 6A and 6B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 49, as shown in FIGS. 6A and 6B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The first cover layer 45 can be formed by ALD or CVD, or any other suitable method.

Figure 7:
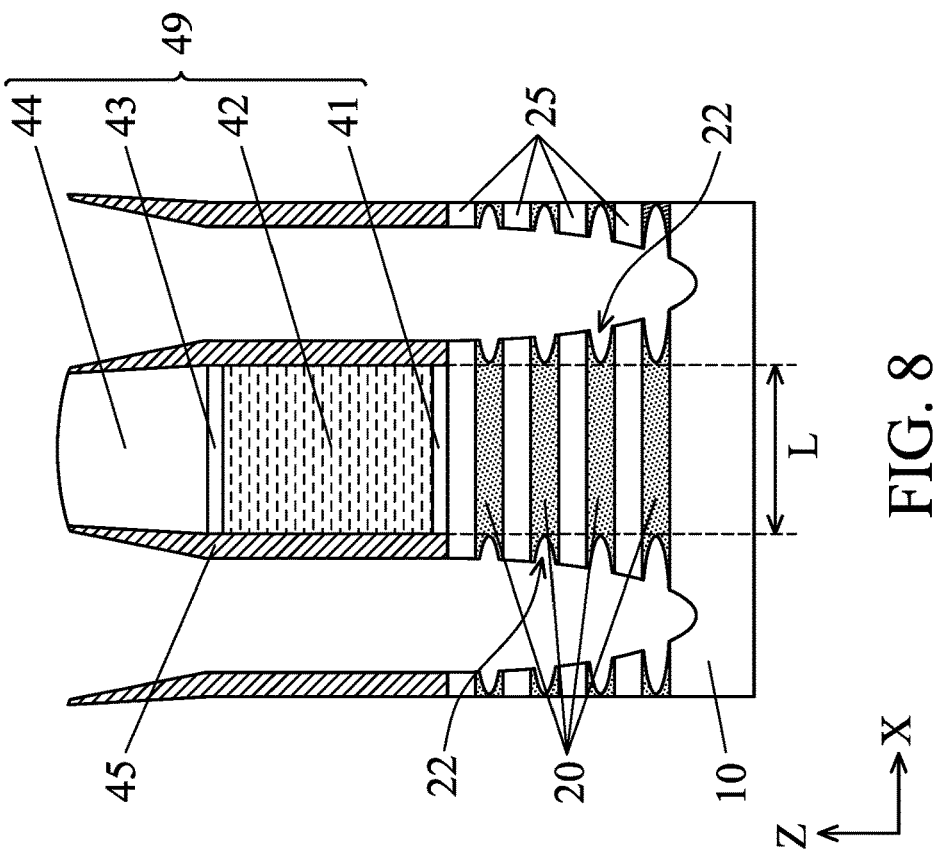
FIG. 7 shows one of the various stages of manufacturing a semiconductor GAA FET device according to an embodiment of the present disclosure.

FIG. 7 shows a cross sectional view along the X direction. Next, as shown in FIG. 7, the first cover layer 45 is anisotropicaly etched to remove the first cover layer 45 disposed on the source/drain region, while leaving the first cover layer 45 as sidewall spacers on side faces of the sacrificial gate structure 49. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part 11 of the fin structures 29) is also partially etched. In some embodiments, an n-type FET and a p-type FET are manufactured separately, and in such a case, a region for one type of FETs is processed, a region for the other type of FETs is covered by a protective layer, such as a silicon nitride.

In some embodiments, as shown in FIG. 7, the source/drain space 21 has a tapered shape having a width gradually decreasing from the top to the bottom (e.g., a U-shape or a V-shape), due to a high aspect ratio of the sacrificial gate structures 49 (a height of the sacrificial gate structure to a space between adjacent sacrificial gate structures). In some embodiments a width of the source/drain space 21 measured at the bottommost first semiconductor layer 20 is about 1-10 nm smaller than that at the uppermost first semiconductor layer 20. The tapered shape of the source/drain space 21 would otherwise cause non-uniform length of the channel region (the second semiconductor layers 25). However, as explained below, since the first semiconductor layers 20 have variable Ge concentrations that cause different etching rates, substantially uniform lengths of the channel regions are obtained.

Figure 8:
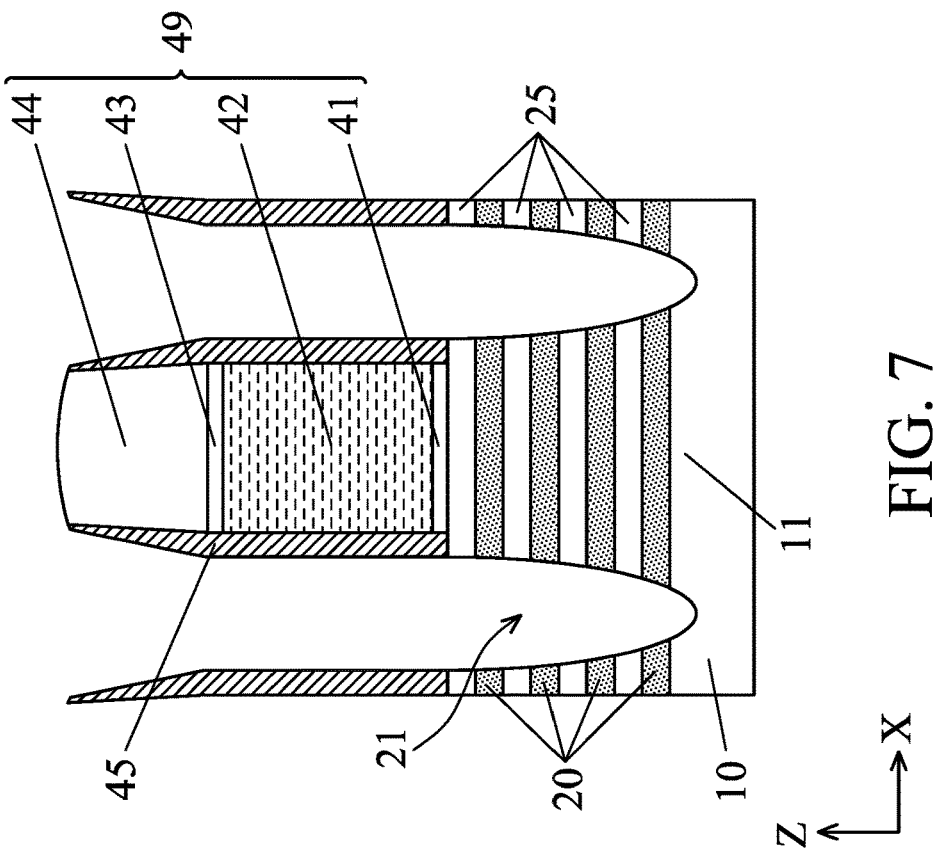
FIG. 8 shows one of the various stages of manufacturing a semiconductor GAA FET device according to an embodiment of the present disclosure.

Further, as shown in FIG. 8, the first semiconductor layers 20 are laterally etched in the X direction within the source/drain space 21, thereby forming cavities 22.

When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. Other etchants may be used.

In some embodiments, since the Ge concentrations of the first semiconductor layers 20 are different (decreasing from the bottom to the top), etching rates of the first semiconductor layers are different, and, the etching rate increases as the Ge concentration increases. Accordingly, a first semiconductor layer having a higher Ge concentration is laterally etched more than a first semiconductor layer having a lower Ge concentration. By adjusting the Ge concentration, after the lateral etching, the remaining first semiconductor layers 20 under the sacrificial gate structure 49 have substantially the same length L (for example, within ±about 2 nm). By using the mixed solution, the end of the first semiconductor layer 20 has a curved shape. In some embodiments, the difference in length of the remaining first semiconductor layers 20 is not zero.

When the first semiconductor layer 20 is made of SiGe having a constant Ge concentration, the wet etching causes more etching at the center portion than the edge portions in the vertical direction due to surface tension and capillary action, and thus the end of the first semiconductor layer has a smiling shape having a deeply etched center region. However, since the Ge concentration at the center region is smaller than the edge portions as shown in FIGS. 4A-4D, the etching rate at the center region is smaller than the etching rate at the edge portions. Accordingly, the smiling shape of the end of the first semiconductor layer 20 can be suppressed, and the curved portion can be reduced.

Figure 9:
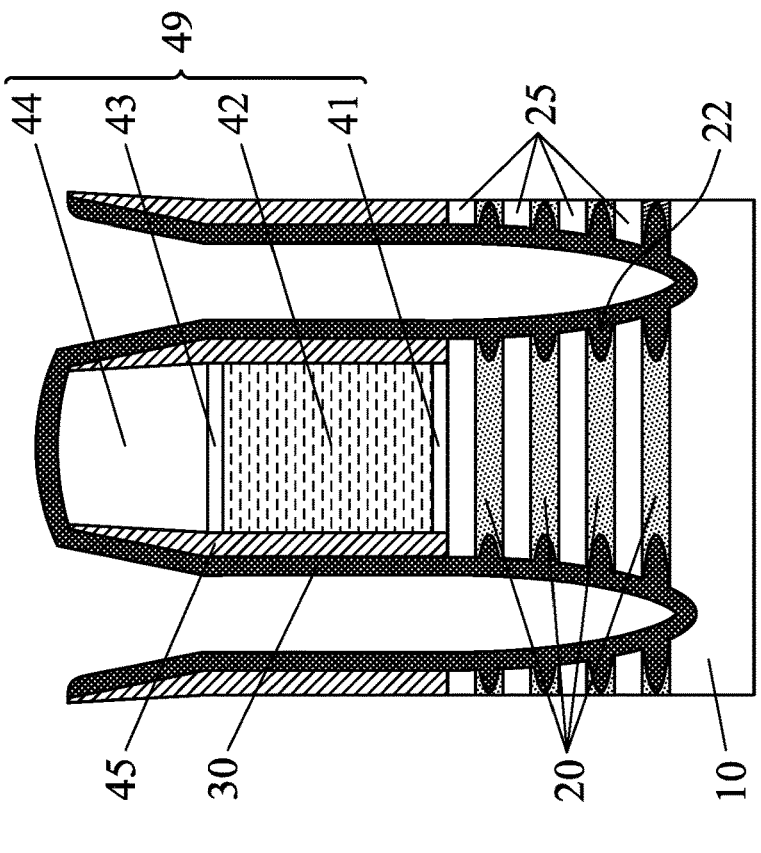
FIG. 9 shows one of the various stages of manufacturing a semiconductor GAA FET device according to an embodiment of the present disclosure.

As shown in FIG. 9, a first insulating layer 30 is conformally formed on the etched lateral ends of the first semiconductor layers 20 and on end faces of the second semiconductor layers 25 in the source/drain space 21 and over the sacrificial gate structure 49. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30. In some embodiments, the first insulating layer 30 includes two or three layers made of different materials from each other. In some embodiments, one of the insulating layers is formed by oxidation of the ends of the first semiconductor layers 20 and the oxide layer is made of silicon-germanium oxide (SiGeO$_x$). In such a case, since the Ge concentration is different among the first semiconductor layers 20, the thickness of the silicon-germanium oxide also varies. In some embodiments, the higher Ge concentration is, the greater the thickness of the silicon-germanium oxide is. In some embodiments, the thickness of the silicon-germanium oxide is in a range from about 0.1 nm to about 1 nm.

Figure 10:
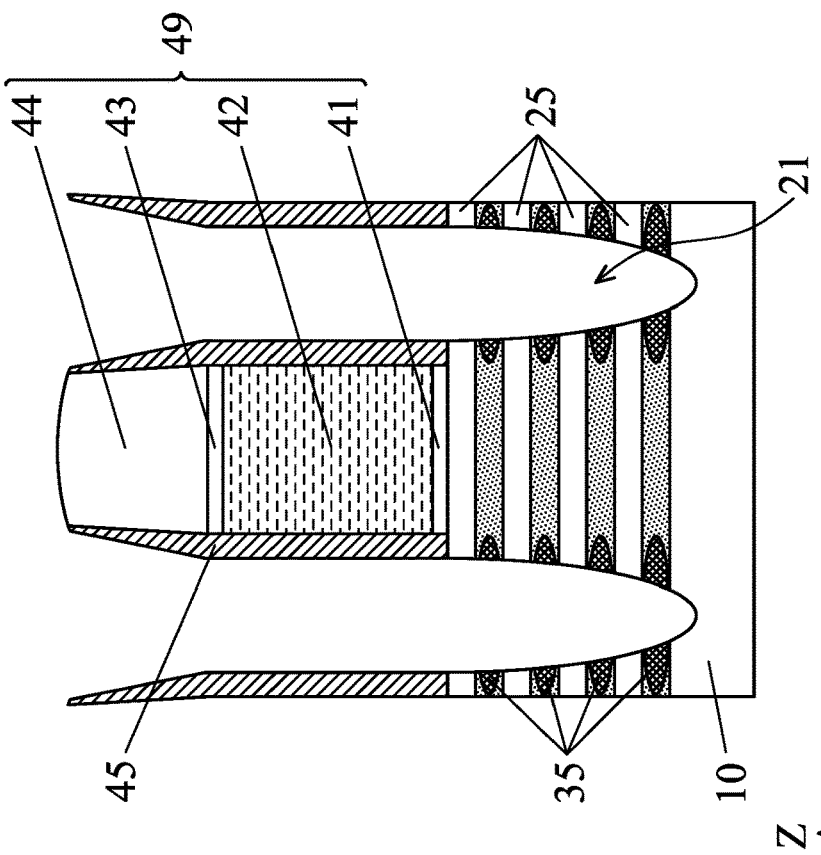
FIG. 10 shows one of the various stages of manufacturing a semiconductor GAA FET device according to an embodiment of the present disclosure.

After the first insulating layer 30 is formed, an etching operation is performed to partially remove the first insulating layer 30, thereby forming inner spacers 35, as shown in FIG. 10. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure.

In some embodiments, as shown in FIG. 10, a width (lateral length) of the inner spacers 35 decreases from the bottom to the top.

Figure 11:
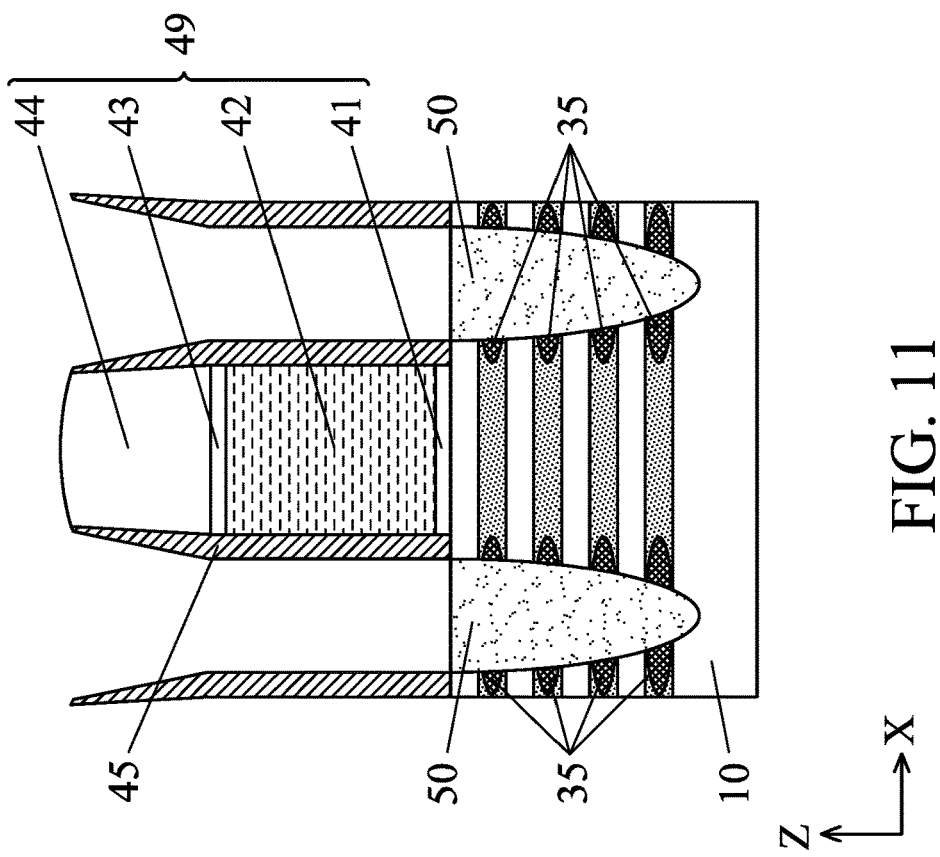
FIG. 11 shows one of the various stages of manufacturing a semiconductor GAA FET device according to an embodiment of the present disclosure.

Subsequently, as shown in FIG. 11, a source/drain epitaxial layer 50 is formed in the source/drain space 21. The source/drain epitaxial layer 50 includes one or more layers of SiP, SiC, SiCP, SiAs, SiPAs (the As concentration is smaller than the P concentration) for an n-type FET. For a p-type FET, the source/drain epitaxial layer (55) includes one or more layers of SiGe, Ge, SiGeSn, GeSn and SiSn. The source/drain epitaxial layer 50 is formed by an epitaxial growth method using CVD, ALD or molecular beam epitaxy (MBE). As shown in FIG. 11, the source/drain epitaxial layer 50 is selectively formed on semiconductor regions. The source/drain epitaxial layer 50 is formed in contact with end faces of the second semiconductor layers 25, and formed in contact with the inner spacers 35.

Figure 12:
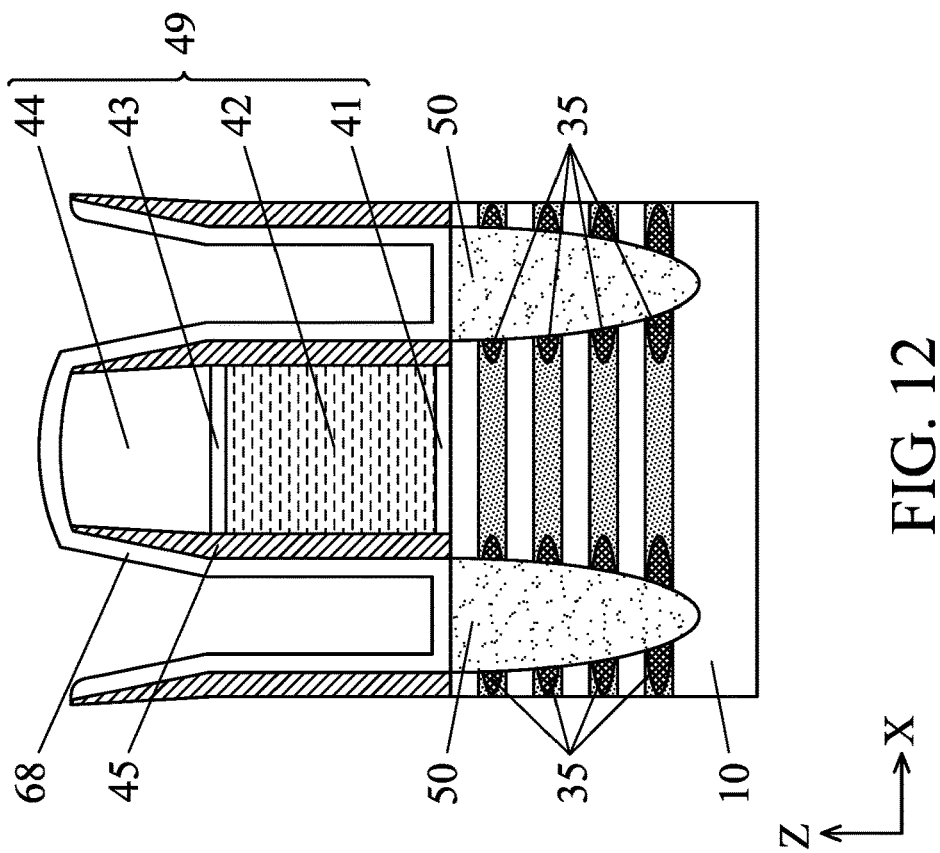
FIG. 12 shows one of the various stages of manufacturing a semiconductor GAA FET device according to an embodiment of the present disclosure.

Then, as shown in FIG. 12, an etch stop layer 68 is formed. The etch stop layer 68 includes one of silicon nitride and silicon oxide, SiON, SiOC, SiCN and SiOCN, or any other suitable dielectric material. The etch stop layer 68 is made of a different material than the sidewall spacers (first cover layer) 45. The etch stop layer 68 can be formed by ALD or any other suitable methods.

Figure 14:
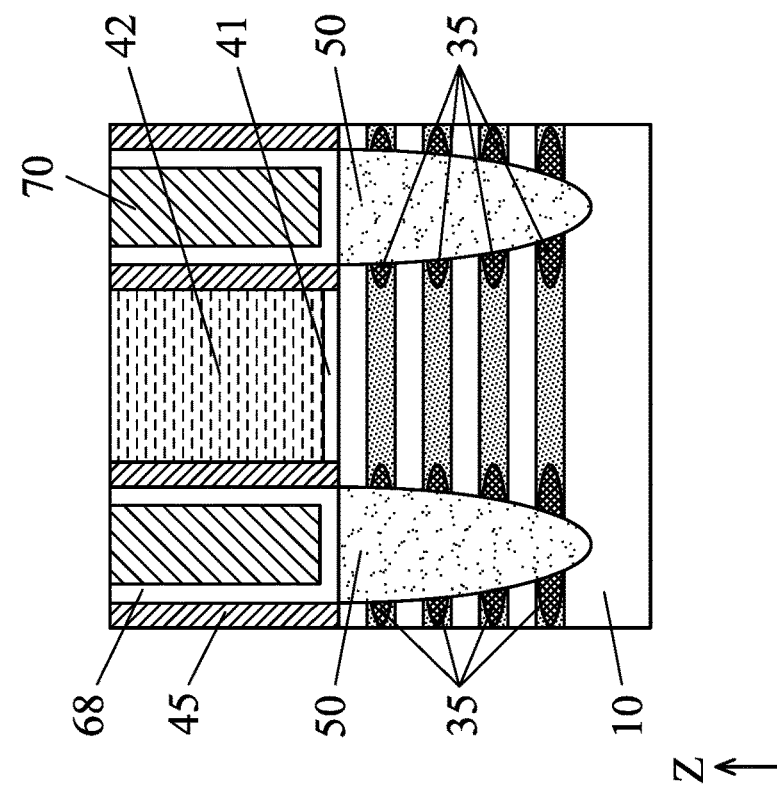
FIG. 14 shows one of the various stages of manufacturing a semiconductor GAA FET device according to an embodiment of the present disclosure.
Figure 13:
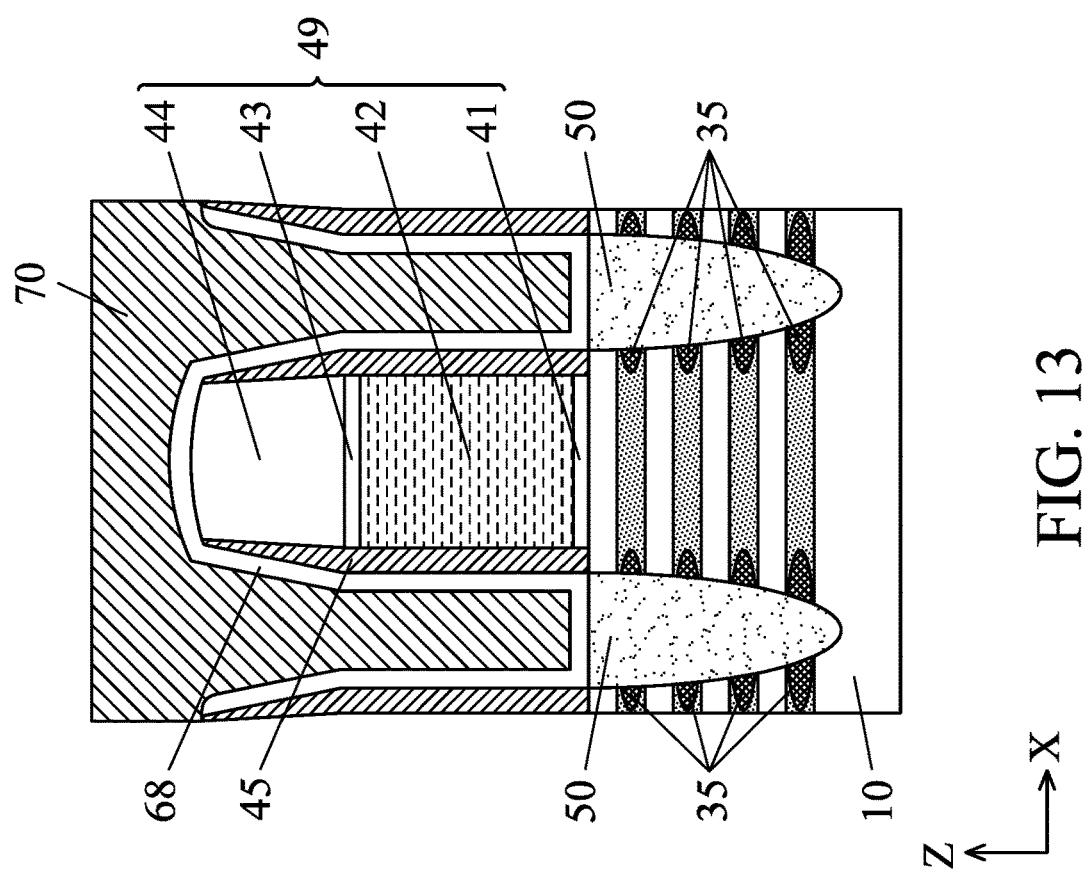
FIG. 13 shows one of the various stages of manufacturing a semiconductor GAA FET device according to an embodiment of the present disclosure.

Next, as shown in FIG. 13, a first interlayer dielectric (ILD) layer 70 is formed over the etch stop layer 68. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed, as shown in FIG. 14.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 15:
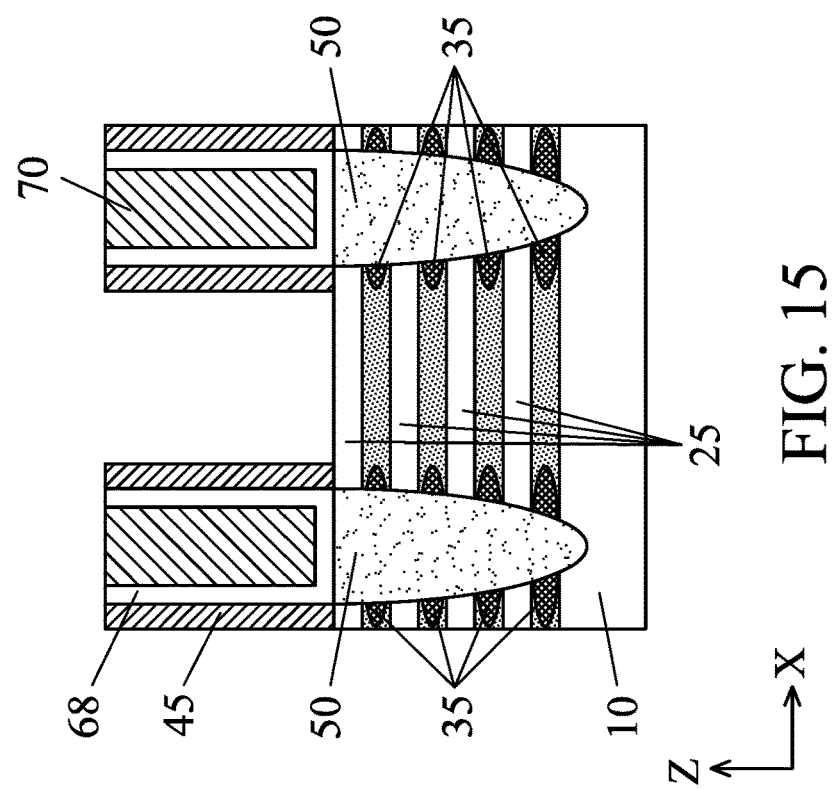
FIG. 15 shows one of the various stages of manufacturing a semiconductor GAA FET device according to an embodiment of the present disclosure.

After the sacrificial gate structures are removed, the first semiconductor layers 20 are removed, thereby forming wires (channel regions) of the second semiconductor layers 25, as shown in FIG. 15. The first semiconductor layers 20 can be removed or etched using an etchant that can selectively etch the first semiconductor layers 20 against the second semiconductor layers 25, as set forth above. As shown in FIG. 15, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20.

As set forth above, since the first semiconductor layers 20 under the sacrificial gate structure have substantially the same length, the effective gate widths (source-to-drain length) Lg of the exposed second semiconductor layers 25 are also substantially the same (for example, more than zero and less than ±about 2 nm).

Figure 16:
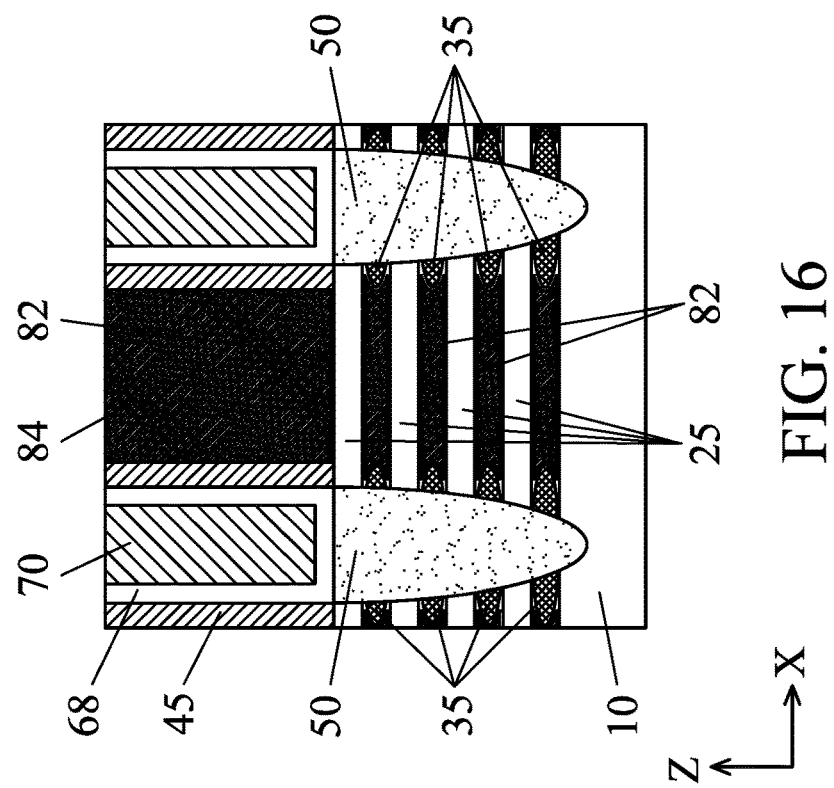
FIG. 16 shows one of the various stages of manufacturing a semiconductor GAA FET device according to an embodiment of the present disclosure.

After the semiconductor wires (channel regions) of the second semiconductor layers 25 are formed, a gate dielectric layer 82 is formed around each channel regions. Further, a gate electrode layer 84 is formed on the gate dielectric layer 82, as shown in FIG. 16. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer is formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 and the etch stop layer 68 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D and 17. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

Figure 17:
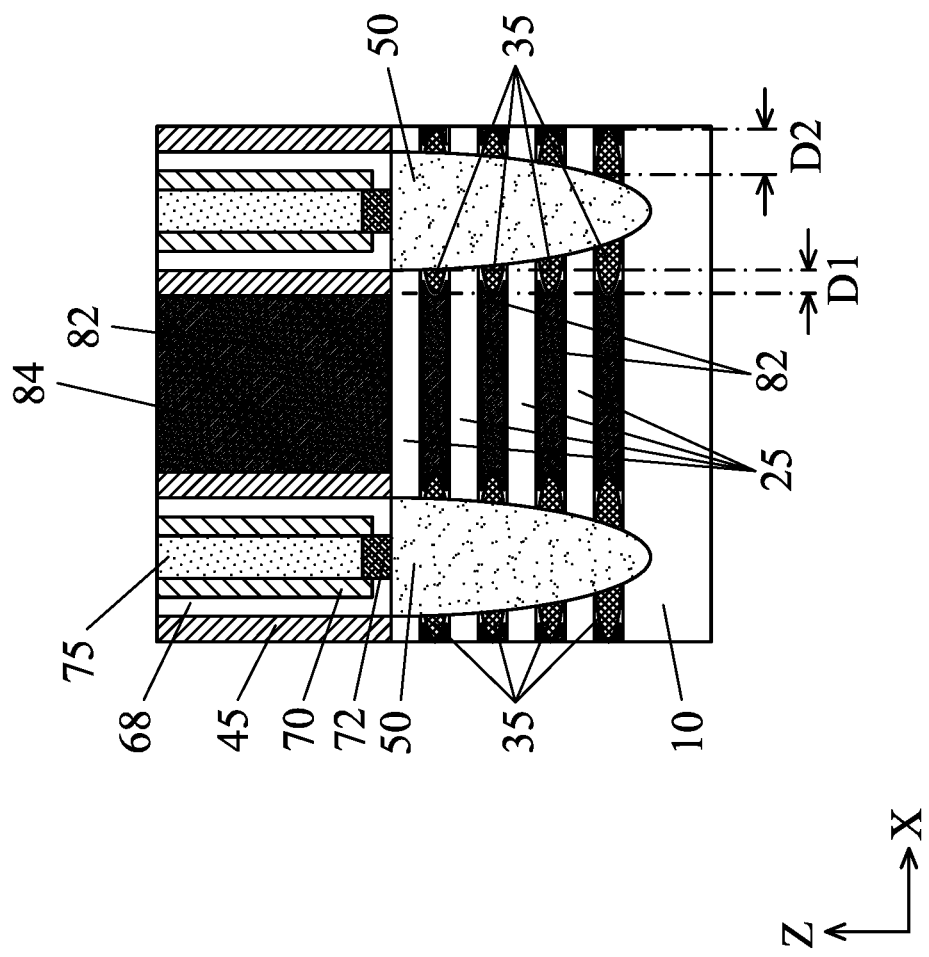
FIG. 17 shows one of the various stages of manufacturing a semiconductor GAA FET device according to an embodiment of the present disclosure.

As shown in FIG. 17, the inner spacers 35 have different width along the vertical (Z) direction. In some embodiments, a difference between a width D1 of the smallest inner spacer (e.g., the top one) and a width D2 of the largest inner spacer (e.g., the bottom one) is in a range from about 0.5 nm to about 10 nm and is in a range from about 1 nm to about 5 nm in other embodiments.

It is understood that the GAA FETs undergo further CMOS processes to form various features such as contacts/vias, interconnect metal layers, dielectric layers, passivation layers, etc.

Figure 18:
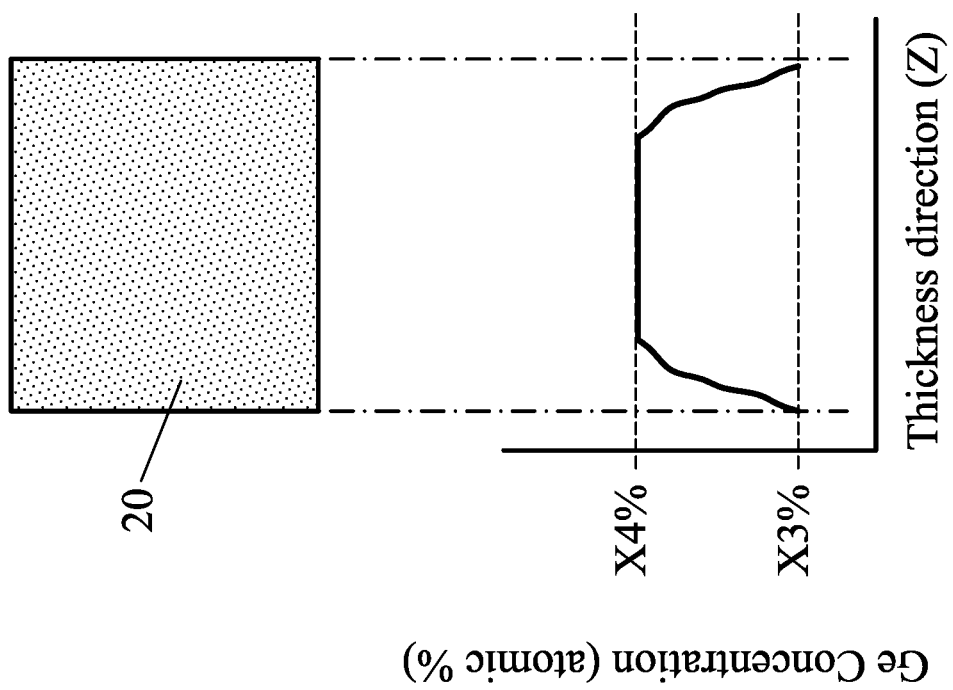
FIG. 18 shows a composition change (profile) of a first semiconductor layer according to another embodiment of the present disclosure.

FIG. 18 shows a composition change (profile) of a first semiconductor layer according to another embodiment of the present disclosure. In some embodiments, depending on an etchant used in laterally etching the first semiconductor layers 20 (see, FIG. 8) and/or the material of the second semiconductor layers 25 (e.g., Group III-V semiconductor), the Ge concentration can be reversed as opposed to that shown in FIG. 4C or 4D. In some embodiments, as shown in FIG. 18, the Ge concentration has a substantially constant portion having a concentration X4 and the Ge concentration decreases to X3 at the edges (interface to the second semiconductor layer 25). In some embodiments, the Ge concentration linearly decreases, and in other embodiments, the Ge concentration decreases gradually (not linear). In some embodiments, X3 is in a range from about 15% to about 35% and is in a range from about 20% to about 30% in other embodiments. In some embodiments, X4 is in a range from about 25% to about 50% and is in a range from about 30% to about 40% in other embodiments. In some embodiments, the thickness of the constant portion is about 20% to about 60% of the total thickness of one first semiconductor layer.

FIGS. 19, 20, 21, and 22 show composition changes (profile) of first semiconductor layers according to embodiments of the present disclosure.

Figure 19:
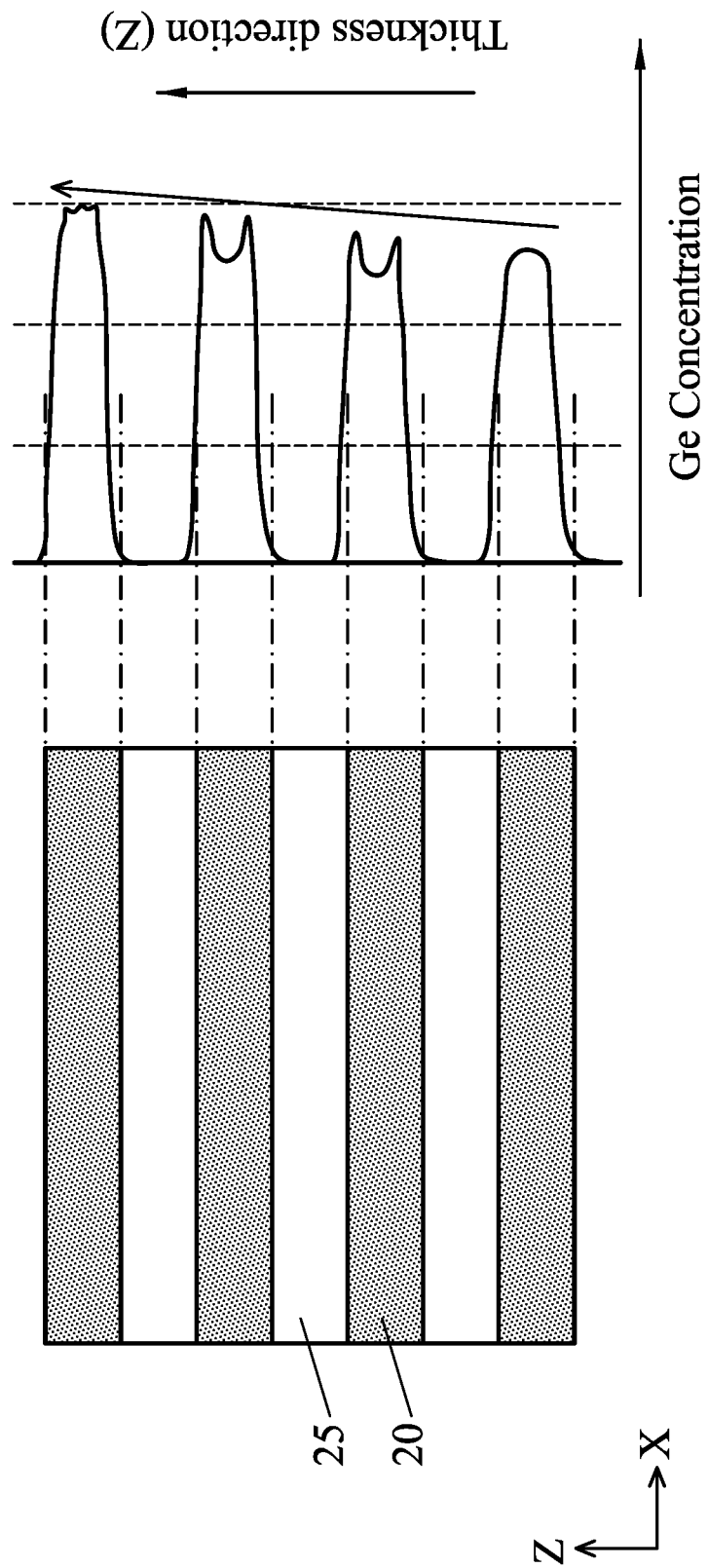
FIGS. 19, 20, 21 and 22 show composition changes (profile) of first semiconductor layers according to embodiments of the present disclosure.

In some embodiments, an etchant used in the lateral etching of the first semiconductor layers 20 as shown in FIG. 8 causes a higher etching rate for a higher Ge concentration. In such a case, the Ge concentration profile among the first semiconductor layer 20 is reversed. In FIG. 19, a Ge concentration in the first semiconductor layers 20 increases from the bottom to the top. Further, in some embodiments, the composition of Ge (or Si) in one or more of the first semiconductor layers 20 varies. In some embodiments, at least one of the lowermost first semiconductor layer and the uppermost first semiconductor layer has a constant Ge concentration, while one or more middle first semiconductor layers have the variable Ge concentration. When the Ge concentration varies within one first semiconductor layer, the Ge concentration may be defined as the average Ge concentration in the one first semiconductor layer.

Figure 20:
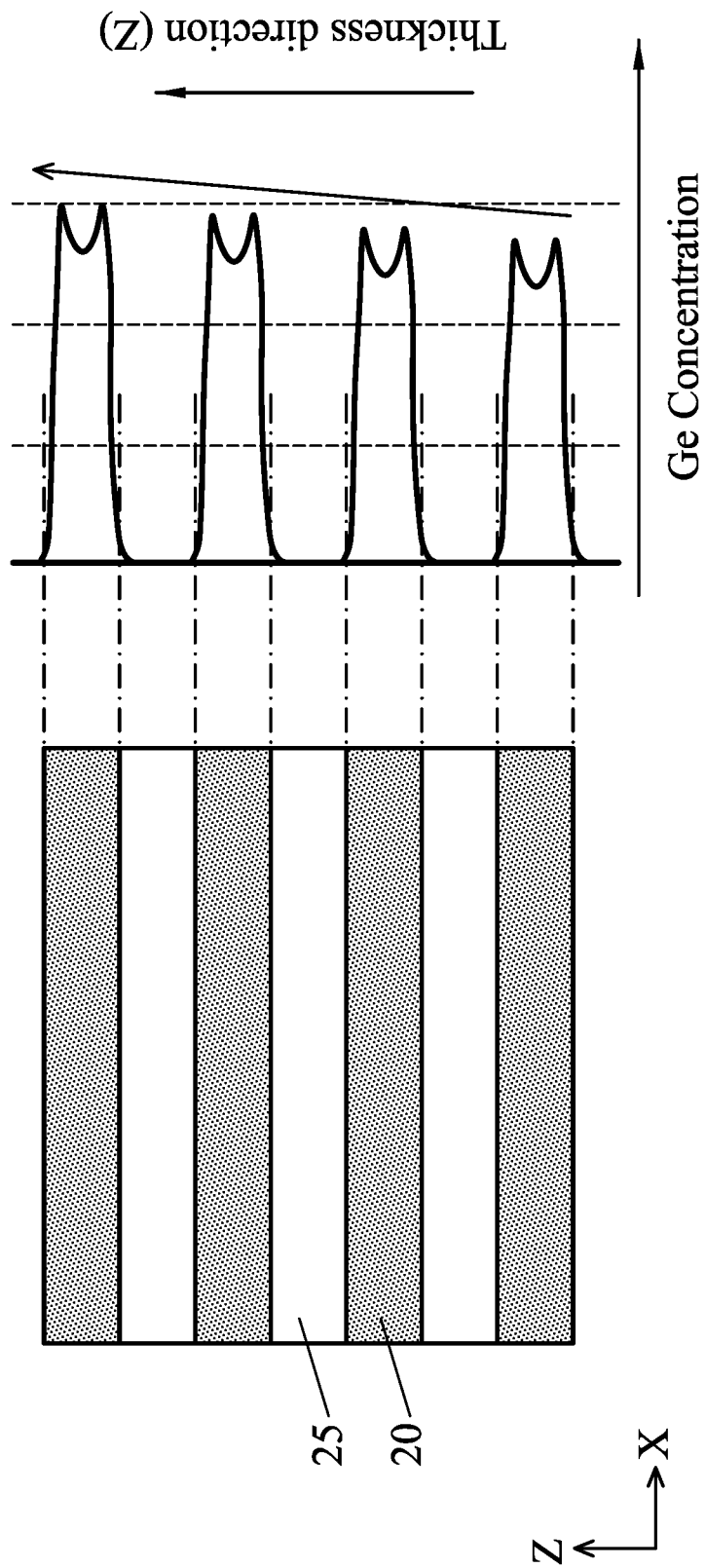
Figure 21:
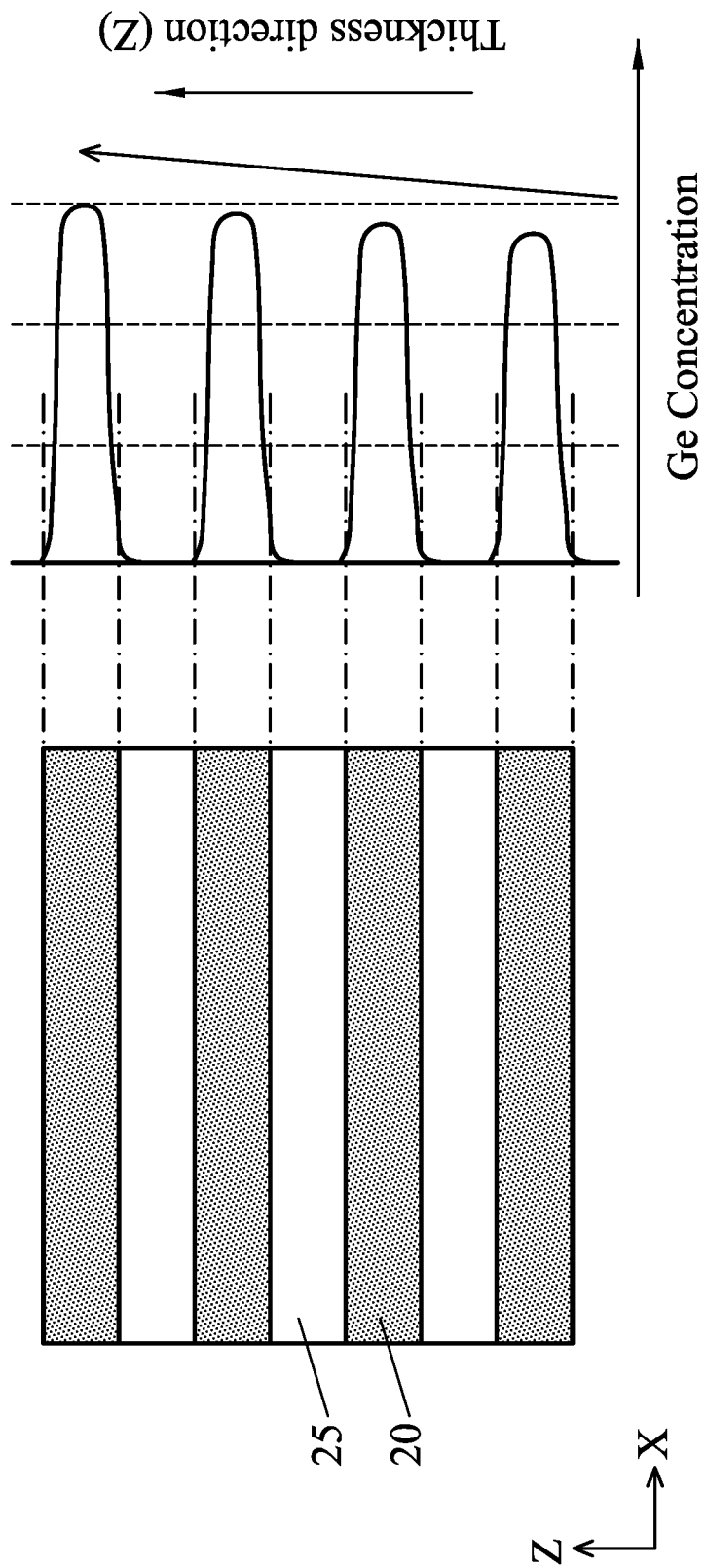

In FIG. 20, all of the first semiconductor layers 20 have the variable Ge concentration as set forth above, and the Ge concentration of the first semiconductor layers 20 increases from the bottom to the top. In FIG. 21, all of the first semiconductor layers 20 have a constant Ge concentration, and the Ge concentration of the first semiconductor layers 20 increases from the bottom to the top.

Figure 22:
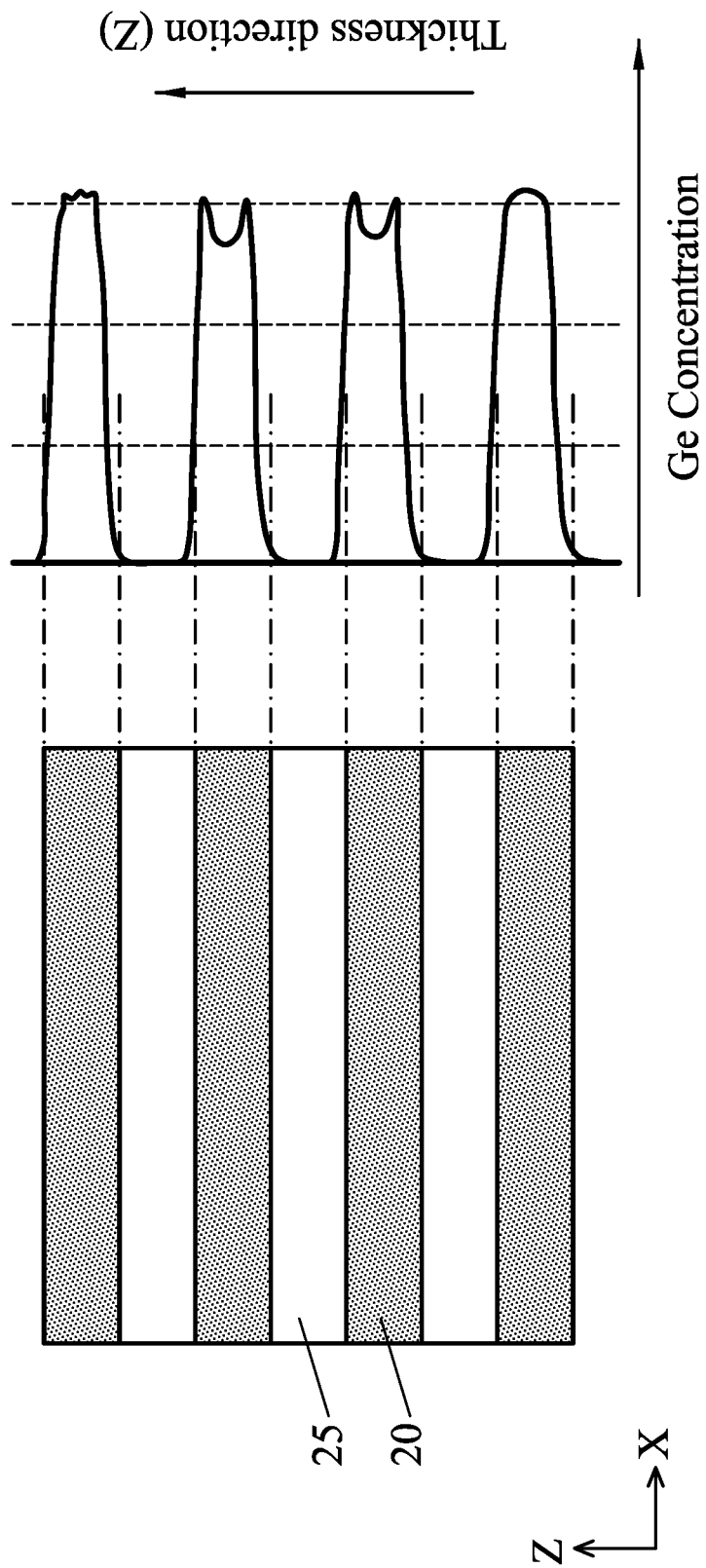

In FIG. 22, the average Ge concentrations of the first semiconductor layers 20 are the substantially the same. In some embodiments, the difference in the Ge concentration is more than zero and less than ±1%. In some embodiments, at least one of the uppermost first semiconductor layer and the bottommost first semiconductor layer has a higher Ge concentration than the remaining first semiconductor layers.

In the present disclosure, by using a modulated Ge concentration for the second semiconductor layers 25 made of SiGe, the etching rates of the second semiconductor layers can be controlled. Accordingly, even if the source/drain space has a non-uniform width (e.g., tapered shape, U-shape or V-shape), by controlling the Ge concentrations, it is possible to obtain substantially the same channel width (length of the first semiconductor layers 20) under the gate electrode after the second semiconductor layers are removed).

The profiles of the modulated or constant Ge concentrations as shown in FIGS. 4A-4E and 18-22 may be selected depending on various device and/or process requirement.

Figure 23:
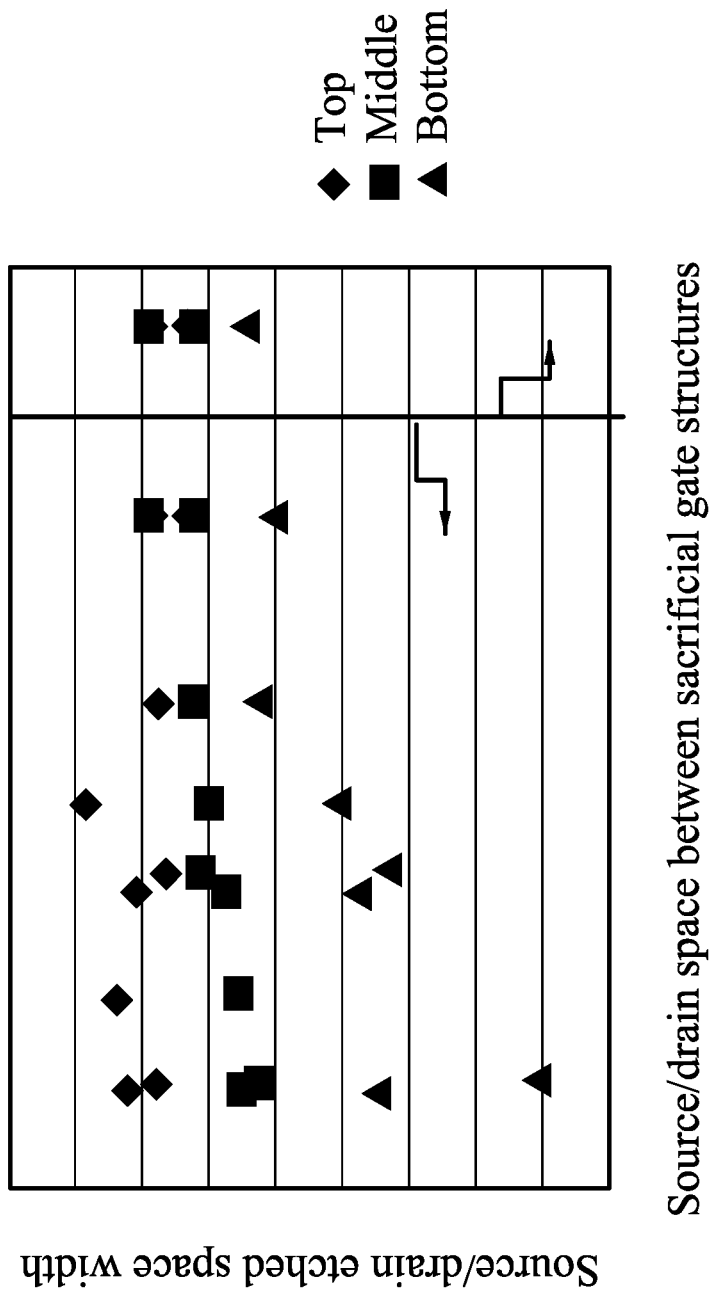
FIG. 23 shows space dependency of source/drain etching.

FIG. 23 shows space dependency of source/drain etching. The horizontal axis shows a space width between adjacent sacrificial gate structures, and the vertical axis shows widths of the etched source/drain space. The Top, Middle and Bottom correspond to the vertical locations of the first semiconductor layers. As shown in FIG. 23, when the space width between adjacent sacrificial gate structures is relatively large (e.g., an aspect ratio of the height of the sacrificial gate structure to the space therebetween is less than about 5), the etched source/drain space width is substantially constant (not tapered or small tapered shape). When the space width between adjacent sacrificial gate structures becomes smaller (e.g., the aspect ratio of the height of the sacrificial gate structure to the space therebetween is equal to or greater than about 5), the etched source/drain space width gradually decreases toward the bottom having a large tapered shape. In some embodiments, depending on the space width between adjacent sacrificial gate structures, the Ge concentration profile is determined to be constant (for a large space width) or to vary (for a small space width). The different Ge profiles are selected within one device to compensate the etching amount variation at different depths in some embodiments.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched, thereby forming a source/drain space, the first semiconductor layers are laterally etched through the source/drain space, and a source/drain epitaxial layer is formed in the source/drain space. At least one of the first semiconductor layers has a composition different from another of the first semiconductor layers. In one or more of the foregoing and following embodiments, the first semiconductor layers are made of SiGe, and the second semiconductor layers are made of Si. In one or more of the foregoing and following embodiments, a Ge concentration of the first semiconductor layers decreases from a bottom one to a top one of the first semiconductor layers. In one or more of the foregoing and following embodiments, at least one of the first semiconductor layers has a Ge concentration which changes along a stacked direction of the first semiconductor layers and second semiconductor layers. In one or more of the foregoing and following embodiments, a difference of a Ge concentration between adjacent first semiconductor layers is in a range from 0.5% to 5.0%. In one or more of the foregoing and following embodiments, the first semiconductor layers are laterally etched by wet etching comprising repeating wet etchings using a mixed solution of $H_2O_2$, $CH_3COOH$ and HF, followed by a $H_2O$ cleaning. In one or more of the foregoing and following embodiments, inner spacers made of a dielectric material are further formed on ends of the etched first semiconductor layers, respectively. A width of a bottom one of the inner spacers is greater than a top one of the inner spacers. In one or more of the foregoing and following embodiments, after the source/drain epitaxial layer is formed, the sacrificial gate structure is removed, thereby exposing a part of the fin structure, the first semiconductor layers are removed from the exposed fin structure, thereby forming channel layers including the second semiconductor layers, and a gate dielectric layer and a gate electrode layer are formed around the channel layers. The gate electrode layer is isolated from the source/drain epitaxial layer by the inner spacer and the gate dielectric layer. In one or more of the foregoing and following embodiments, in the at least one of the first semiconductor layers, a Ge concentration at a center region is smaller than a Ge concentration at edge regions along the stacked direction. In one or more of the foregoing and following embodiments, the source/drain space has a width gradually decreasing from a top to a bottom.

In accordance with another aspect of the present disclosure, in a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched, thereby forming a source/drain space having a tapered shape, the first semiconductor layers are laterally etched through the source/drain space, inner spacers made of a dielectric material are formed on ends of the etched first semiconductor layers, and a source/drain epitaxial layer is formed in the source/drain space. The source/drain space has a width that gradually decreases from a top to a bottom, and after the inner spacers are formed, a length of one of the etched first semiconductor layers under the sacrificial gate structures is different from a length of another of the etched first semiconductor layers under the sacrificial gate structures. In one or more of the foregoing and following embodiments, a difference of lengths of the etched first semiconductor layers under the sacrificial gate structures is more than zero and less than 2 nm. In one or more of the foregoing and following embodiments, the first semiconductor layers are made of SiGe, and the second semiconductor layers are made of Si. In one or more of the foregoing and following embodiments, a Ge concentration of the first semiconductor layers decreases from a bottom one to a top one of the first semiconductor layers. In one or more of the foregoing and following embodiments, a Ge concentration of the first semiconductor layers increases from a bottom one to a top one of the first semiconductor layers.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively, the spaces being defined by adjacent semiconductor wires or sheets, the gate electrode layer and the source/drain region. Width of the insulating spacers along a source-to-drain direction decreases from a bottom one of the insulating spacers closest to the substrate to a top one of the insulating spacers. In one or more of the foregoing and following embodiments, a length of a channel region of one of the semiconductor wires under the gate electrode layer is different from a length of a channel region of another of the semiconductor wires under the gate electrode. In one or more of the foregoing and following embodiments, a difference of lengths of channel regions of the semiconductor wires under the gate electrode is more than zero and less than 1 nm. In one or more of the foregoing and following embodiments, a difference between a width of a topmost one of the inner spacers and a width of a bottommost one of the inner spacers is in a range from 0.5 nm to 10 nm. In one or more of the foregoing and following embodiments, a lateral end of the inner spacers in contact with the gate dielectric layer has a curved shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked along a stacked direction;
    forming a sacrificial gate structure over the fin structure;
    etching a source/drain region of the fin structure, which is not covered by the sacrificial gate structure, thereby forming a source/drain space;
    laterally etching the first semiconductor layers through the source/drain space; and
    forming a source/drain epitaxial layer in the source/drain space,
    wherein a composition of at least one of the first semiconductor layers varies, within the at least one of the first semiconductor layers, along the stacked direction,
    the first semiconductor layers comprise SiGe and the second semiconductor layers comprise Si,
    a Ge concentration of the first semiconductor layers decreases from a bottom one closest to a substrate to a top one of the first semiconductor layers, and
    a difference of a Ge concentration between adjacent first semiconductor layers is in a range from 0.5% to 5.0%.

2. The method of claim 1, wherein at least one of the first semiconductor layers has a constant Ge concentration.

3. The method of claim 2, wherein the first semiconductor layers are laterally etched by wet etching comprising repeating wet etchings using a mixed solution of $H_2O_2$, $CH_3COOH$ and HF, followed by a $H_2O$ cleaning.

4. The method of claim 1, wherein in the at least one of the first semiconductor layers, a Ge concentration at a center region of the at least one of the first semiconductor layers is smaller than a Ge concentration at edge regions of the at least one of the first semiconductor layers, along the stacked direction.

5. The method of claim 1, further comprising forming inner spacers made of a dielectric material on ends of the etched first semiconductor layers, respectively, wherein a width of a bottom one of the inner spacers is greater than a top one of the inner spacers.

6. The method of claim 5, further comprising, after the source/drain epitaxial layer is formed:
    removing the sacrificial gate structure, thereby exposing a part of the fin structure;
    removing the first semiconductor layers from the exposed fin structure, thereby forming channel layers including the second semiconductor layers; and
    forming a gate dielectric layer and a gate electrode layer around the channel layers,
    wherein the gate electrode layer is isolated from the source/drain epitaxial layer by the inner spacer and the gate dielectric layer.

7. The method of claim 1, wherein the source/drain space has a width that gradually increases from a bottom to a top.

8. The method of claim 1, wherein a Ge concentration of the first semiconductor layers decreases from a bottom one to a top one of the first semiconductor layers, wherein the bottom one is closer to the substrate than the top one.

9. A method of manufacturing a semiconductor device, comprising:
    forming a fin structure in which first semiconductor layers and second semiconductor layers are alternately stacked over a substrate;
    forming a sacrificial gate structure over the fin structure;
    etching a source/drain region of the fin structure, thereby forming a source/drain space having a tapered shape;
    laterally etching the first semiconductor layers through the source/drain space;
    forming inner spacers made of a dielectric material on ends of the etched first semiconductor layers; and
    forming a source/drain epitaxial layer in the source/drain space,
    wherein the first semiconductor layers comprise a first layer having a constant composition within the first layer, and a second layer having a variable composition within the second layer,
    the first semiconductor layers further comprise a third layer having a constant composition within the third layer, and
    the second layer is disposed between the first layer and the third layer.

10. The method of claim 9, wherein a difference of lengths of the etched first semiconductor layers under the sacrificial gate structures is more than zero and less than 1 nm.

11. The method of claim 9, wherein:
    the first semiconductor layers are made of SiGe, and
    the second semiconductor layers are made of Si.

12. The method of claim 9, wherein the first semiconductor layers are laterally etched by wet etching comprising repeating wet etchings using a mixed solution of $H_2O_2$, $CH_3COOH$ and HF, followed by a $H_2O$ cleaning.

13. The method of claim 9, wherein a width of a bottom one of the inner spacers is greater than a top one of the inner spacers.

14. A method of manufacturing a semiconductor device, comprising:
    forming a stacked layer, in which first semiconductor layers and second semiconductor layers are alternately stacked, over a substrate;
    patterning the stacked layer into a fin structure;
    forming a sacrificial gate structure over the fin structure;
    etching a source/drain region of the fin structure, thereby forming a source/drain space;
    laterally etching the first semiconductor layers through the source/drain space;

forming inner spacers made of a dielectric material on ends of the etched first semiconductor layers; and forming a source/drain epitaxial layer in the source/drain space, wherein:

the first semiconductor layers are made of SiGe, and a Ge concentration of the first semiconductor layers decreases from a top one to a bottom one of the first semiconductor layers, wherein the bottom one is closer to the substrate than the top one.

15. The method of claim 14, wherein in at least one of the first semiconductor layers, a Ge concentration changes, within the at least one of the first semiconductor layers, along a stacked direction of the first semiconductor layers and second semiconductor layers.

16. The method of claim 15, wherein at least one of the first semiconductor layers has a constant Ge concentration.

17. The method of claim 15, wherein in the at least one of the first semiconductor layers, the Ge concentration at a center region is smaller than a Ge concentration at edge regions along a stack direction.

18. The method of claim 17, wherein the Ge concentration has two peaks along the stacked direction.

19. The method of claim 14, wherein the first semiconductor layers are laterally etched by wet etching comprising repeating wet etchings using a mixed solution of $H_2O_2$, $CH_3COOH$ and HF, followed by a $H_2O$ cleaning.

20. The method of claim 14, wherein a width of a bottom one of the inner spacers is greater than a top one of the inner spacers.

* * * * *